US011422595B2

(12) United States Patent
Le Goff et al.

(10) Patent No.: US 11,422,595 B2
(45) Date of Patent: Aug. 23, 2022

(54) METHOD AND SYSTEM FOR SUPERVISING A HEALTH OF A SERVER INFRASTRUCTURE

(71) Applicant: OVH, Roubaix (FR)

(72) Inventors: Morvan Le Goff, Brech (FR); Raphael Glon, Plaintel (FR); Sylvain Chenot, Hem (FR); Alexis Autret, Brest (FR)

(73) Assignee: OVH, Roubaix (FR)

( * ) Notice: Subject to any disclaimer, the term of this patent is extended or adjusted under 35 U.S.C. 154(b) by 293 days.

(21) Appl. No.: 16/859,172

(22) Filed: Apr. 27, 2020

(65) Prior Publication Data

US 2020/0379529 A1 Dec. 3, 2020

(30) Foreign Application Priority Data

Apr. 30, 2019 (EP) .................................... 19315028

(51) Int. Cl.
| G06F 15/16 | (2006.01) |
| G06F 1/20 | (2006.01) |
| G06N 20/00 | (2019.01) |
| G01K 1/022 | (2021.01) |
| G06K 9/62 | (2022.01) |
| H04L 43/10 | (2022.01) |

(52) U.S. Cl.
CPC ............. G06F 1/206 (2013.01); G01K 1/022 (2013.01); G06K 9/6256 (2013.01); G06N 20/00 (2019.01); H04L 43/10 (2013.01)

(58) Field of Classification Search
None
See application file for complete search history.

(56) References Cited

U.S. PATENT DOCUMENTS 10,938,634 B1 * 3/2021 Cruise ................ H04L 41/0686

FOREIGN PATENT DOCUMENTS

EP 2977852 A1 1/2016

OTHER PUBLICATIONS

J. Chen et al., "A High-Fidelity Temperature Distribution Forecasting System for Data Centers," 2012 IEEE 33rd Real-Time Systems Symposium, 2012, pp. 215-224, doi: 10.1109/RTSS.2012.73.*

(Continued)

*Primary Examiner* — Brian Whipple
*Assistant Examiner* — Gregory P Tolchinsky
(74) *Attorney, Agent, or Firm* — BCF LLP

(57) ABSTRACT

A health of a server infrastructure is supervised by sending measurement requests, from a polling node to a server of the server infrastructure, at each of successive polling periods. Measurements received from the server in response to the measurement requests are stored in a database. A machine learning system is trained using accumulated measurements stored in the database to construct a prediction model for the server. Compliance of a latest measurement received from the server with the prediction model for the server is evaluated. A corrective action is taken if the latest measurement does not comply with the prediction model for the server. Measurements received from a group of servers may be aggregated and the machine learning system may construct a prediction model for the group of servers. Compliance to the prediction model may be evaluated for the group of servers.

18 Claims, 16 Drawing Sheets

(56) References Cited

OTHER PUBLICATIONS

Zabbix Documentation 4.0, https://www.zabbix.com/documentation/4.0/manual/introduction/about, accessed Apr. 4, 2019, pdf 1 page.

Shetu et al., "Workload-based prediction of CPU temperature and usage for small-scale distributed systems", 4th International Conference on Computer Science and Network Technology (ICCSNT), 2015, pp. 1090-1093, https://ieeexplore.ieee.org/document/7490925, accessed Apr. 4, 2019, Abstract 1 page pdf.

Shipmon et al., "Time Series Anomaly Detection, Detection of Anomalous Drops with Limited Features and Sparse Examples in Noisy Highly Periodic Data", https://static.googleusercontent.com/media/research.google.com/fr//pubs/archive/dfd834facc9460163438b94d53b36f51bb5ea952.pdf, accessed Apr. 4, 2019, pdf 9 pages.

Extended European Search Report with regard to the EP Patent Application No. 19315028.1 completed Dec. 19, 2019.

* cited by examiner

METHOD AND SYSTEM FOR SUPERVISING A HEALTH OF A SERVER INFRASTRUCTURE

CROSS-REFERENCE

The present application claims priority from European patent application no 19315028.1, filed on Apr. 30, 2019, the disclosure of which is incorporated by reference herein.

FIELD

The present technology relates to the field of data processing systems. In particular, the systems and methods for supervising a health of a server infrastructure.

BACKGROUND

Datacenters and cloud infrastructure integrate many servers to provide mutualized hosting services to large numbers of clients. Datacenters may include hundreds of thousands of servers and host millions of domains for their clients. Servers are assembled in racks and a plurality of racks is installed in a room. A large datacenter may include a plurality of such rooms. Any given server may be dedicated to a particular client and may include one or more processors, also called central processing units (CPU), mounted on motherboards of the servers.

Service demands from the clients usually vary over time and may be very intense at times. The health of a datacenter is monitored in order to optimize its capability to meet the quality of service that clients expect. One particular parameter of the servers of a datacenter that may be monitored is the temperature of its processors. Heavy demands on a server causes an increase of load on its processors and generally results in an increase of temperature of the processors. Other factors that may impact the temperature of a particular processor include a general temperature of a rack in which the particular processor is mounted, an ambient temperature of a room where the rack is installed, a condition of a cooling system that provides cooling to a plurality of processors mounted in the rack, and general environmental conditions of the datacenter where the particular processor is installed. Another factor that may impact the temperature and lifetime of a particular processor includes a supply voltage, particularly when the supply voltage lies outside of the recommended supply voltage range for the processor. Other parameters of the servers of a datacenter that may be monitored to maintain the performance and lifetime of the servers include, for example temperatures and/or voltages of other components mounted on the motherboards, such as chipsets, memory devices, network interface components, and hard drives Large datacenters are conventionally equipped with high capacity air-forced cooling systems. OVH of Roubaix, France, has recently replaced or supplemented air-forced cooling systems with more efficient water-cooling systems In some applications, processors are physically mounted on water-cooling devices that are fed with water flows provided to the several racks of the datacenters.

Whether air-forced cooling, water-cooling or a combination is used to control the temperature of the processors in a rack, overheating of a processor may still occur. Overheating may for example be caused by a failure of the cooling system or failure of one of its components, by a lack of cooling capacity in view of the actual needs of the datacenter, by an abnormal supply voltage to the servers, and other reasons. The provision of an abnormal supply voltage to the servers may also cause a reduction of the lifetime of its hardware components Immediate actions, such as automatic throttling or emergency shutdown of a server, may be taken when a high-temperature threshold is exceeded. Negative consequences on the provision of services to clients are to be expected when some software features are temporarily disabled due to throttling, or when servers are shutdown without advanced warning. For that reason, preventive measures allowing to predict overheating and other conditions that may be detrimental to service provisioning would be preferred.

Monitoring the health of a large number of servers in a datacenter or in a cloud infrastructure is further rendered complicated by various operational, commercial and legal considerations. Firstly, conventional techniques used to monitor the temperature and other operational parameters of a server may impact the performance of the server, for example by adding more demands on its processors. Secondly, the servers of a datacenter may not all be identical. Rather, the datacenter may comprise a heterogeneous variety of servers having different hardware and/or software structures. Thirdly, clients generally wish to maintain the confidentiality of their information. The operator of a datacenter is thus required to monitor the health of the servers without being provided access to the operating systems running on the servers. Finally, the operator is bound to comply with legal requirements such as those of the General Data Protection Regulation (GDPR) on data protection and privacy. When a server is no longer serving a client and becomes assigned to a new client, performance-monitoring data related to the previous client cannot be made available to the new client.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) impact of conventional monitoring techniques on the performance of servers; (2) incomplete support of heterogeneous server architectures; and/or (3) incomplete compliance to legal considerations.

In one aspect, various implementations of the present technology provide a method (600) for supervising a health of a server infrastructure, comprising:

sending (605) measurement requests, from a polling node (510, 515) to a server (400) of the server infrastructure, at each of successive polling periods storing (620), in a database (520), measurements received from the server (400) in response to the measurement requests;

training (625) a machine learning system (525) using accumulated measurements stored in the database (520) to construct a prediction model for the server (400);

evaluating (660) a compliance of a latest measurement received from the server (400) with the prediction model for the server (400); and taking (670) a corrective action if the latest measurement does not comply with the prediction model for the server (400).

In some implementations of the present technology, the method (600) further comprises receiving (630) a new measurement from the server (400); storing (635) the new measurement in the database (520); and using the new measurement to update the prediction model.

In some implementations of the present technology, evaluating (660) the compliance of the latest measurement received from the server (400) with the prediction model for the server (400) comprises: defining (650) a normal variation from the prediction model for the server (400); and determining (662) that the latest measurement complies with the prediction model for the server (400) if a difference between the latest measurement and a corresponding value defined by the prediction model for the server (400) is less than or equal to the normal variation.

In some implementations of the present technology, the method (600) further comprises receiving (652) a current value for a secondary parameter related to the server (400); calculating (654) a difference between the current value for the secondary parameter related to the server (400) and a previous value for the secondary parameter related to the server (400); and if the difference between the current and the previous value for the secondary parameter related to the server (400) exceeds a predetermined threshold, increasing (656) a magnitude of the normal variation from the prediction model for the server (400).

In some implementations of the present technology, the measurement is a temperature of a processor (410) of the server (400); and the corrective action is selected from increasing a heat transfer rate of a cooling system for the server (400), reducing a processing speed of the server (400), reducing a processing power of the server (400), reducing a traffic load directed to the server (400), transferring a virtual machine from the server (400) to another server (400), reducing a period for storing the measurements received from the server (400), and a combination thereof.

In some implementations of the present technology, the method (600) further comprises sending (605) a plurality of measurement requests from the polling node (510, 515) to a corresponding plurality of servers (400) at each of the successive polling periods; storing (620), in the database (520), respective measurements received from each of the plurality of servers (400) at each of the successive polling periods; and training (625) the machine learning system (525) using the respective stored measurements to construct a prediction model for each of the plurality of servers (400).

In some implementations of the present technology, the method (600) further comprises consolidating (615) the respective measurements received at each given polling period from a subset of the plurality of servers (400), wherein the servers (400) of the subset are installed on a same rack, in a same room or in a same datacenter (500); aggregating (710) the respective measurements received at each given polling period from the subset of the plurality of servers (400); training (720) the machine learning system (525) using the aggregated measurements to construct a prediction model for the subset of the plurality of servers (400); and evaluating (740) a compliance of latest aggregated measurements with the prediction model for the subset of the plurality of servers (400).

In some implementations of the present technology, the method (600) further comprises defining (730) a normal variation from the prediction model for the subset of the plurality of servers (400); and determining (742) that the latest aggregated measurements comply with the prediction model for the subset of the plurality of servers (400) if a difference between the latest aggregated measurements and a corresponding value defined by the prediction model for the subset of the plurality of servers (400) is less than or equal to the normal variation.

In other aspects, various implementations of the present technology provide a system for supervising a health of a server infrastructure, comprising:

a polling node (510, 515) configured to send a measurement request to one or more servers (400) of the server infrastructure at each of successive polling periods;

a database (520) configured to:
  receive measurements from the one or more servers (400) of the server infrastructure, wherein the measurements are received in response to the measurement requests, and
  store the measurements received from the one or more servers (400); a machine learning system (525) configured to:
  read the stored measurements for each of the one or more servers (400) from the database (520), and
  for each respective server (400), construct a prediction model based on measurements stored in the database (520) at successive polling periods for the respective server (400); and an evaluator (530) operatively connected to the database (520), the machine learning system (525) and the polling node (510, 515), the evaluator (530) being configured to:
  receive, from a given server (400), a latest measurement for the given server (400),
  evaluate a compliance of the latest measurement for the given server (400) with the prediction model for the given server (400), and
  initiate a corrective action for the given server (400) if the latest measurement does not comply with the prediction model for the given server (400).

In some implementations of the present technology, the system further comprises an operator console (550) operatively connected to the evaluator (530), the operator console (550) being configured to issue an alert if the latest measurement for the given server (400) does not comply with the prediction model for the given server (400).

In some implementations of the present technology, the system further comprises an action controller (535) operatively connected to the evaluator (530), the action controller (535) being configured to cause the given server (400) to apply the corrective action selected from increasing a heat transfer rate of a cooling system for the given server (400), reducing a processing speed of the given server (400), reducing a processing power of the given server (400), reducing a traffic load directed to the given server (400), transferring a virtual machine from the given server (400) to another server (400), and a combination thereof.

In further aspects, various implementations of the present technology provide a datacenter (500), comprising:

a plurality of servers (400), each server (400) comprising a sensor (450, 460, 470, 480) configured to provide a measurement;

a repository (505) configured to store identities of each of the plurality of servers (400);

a polling node (510, 515) configured to:

acquire a list of servers (400) from the repository (505), and send, at each of successive polling periods, a measurement request to each server (400) of the list of servers (400);

a database (520) configured to:

receive measurements from each server (400) of the list of servers (400) at each of the successive polling periods, and store the received measurements;

a machine learning system (525) configured to:

read the stored measurements for each respective server (400) from the database (520), and construct a prediction model for each respective server (400) based on the stored measurements for the respective server (400);

an evaluator (530) configured to:

receive a latest measurement from a given server (400), fetch the prediction model for the given server (400) from the machine learning system (525), and evaluate a compliance of the latest measurement with the prediction model for the given server (400); and an action controller (535) configured to:

receive a compliance result for the given server (400) from the evaluator (530), and take a corrective action for the given server (400) if the latest measurement does not comply with the prediction model for the given server (400).

In some implementations of the present technology, the polling node (510, 515) is one of a plurality of polling nodes (510, 515); the list of servers (400) is one of a plurality of lists of servers (400), each polling node (510, 515) of the plurality of polling nodes (510, 515) acquiring a corresponding list of the plurality of lists; and the datacenter (500) further comprises an allocating processor (540) configured to allocate each server (400) of the plurality of servers (400) to one of the plurality of lists of servers (400).

In some implementations of the present technology, the servers (400) of the plurality of servers (400) are assembled in groups, each group of servers (400) being installed in a common rack or in a common room of the datacenter (500); the datacenter (500) further comprises an aggregator (545) configured to consolidate and aggregate respective measurements received at each given polling period from the servers (400) of the given group; the database (520) is further configured to store the aggregated measurements; the machine learning system (525) is further configured to construct a prediction model for the servers (400) of the given group based on the aggregated measurements; and the evaluator (530) is further configured to evaluate a compliance of latest aggregated measurements with the prediction model for the servers (400) of the given group.

In some implementations of the present technology, each server (400) of the plurality of servers (400) comprises a processor (410) and a board management controller, BMC (430), operatively connected to the processor (410) and to the sensor (450, 460, 470, 480); the measurement provided by the sensor (450, 460, 470, 480) of each server (400) is a measurement of an operational parameter of the processor (410) the server (400); on each server (400), the BMC (430) is configured to receive the measurement request from the polling node (510, 515) and, in response to receiving the measurement request from the polling node (510, 515), read the measurement from the sensor (450, 460, 470, 480) and transmit the measurement to the polling node (510, 525) and; the polling node (510, 515) is further configured to forward the measurement to the database (520).

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
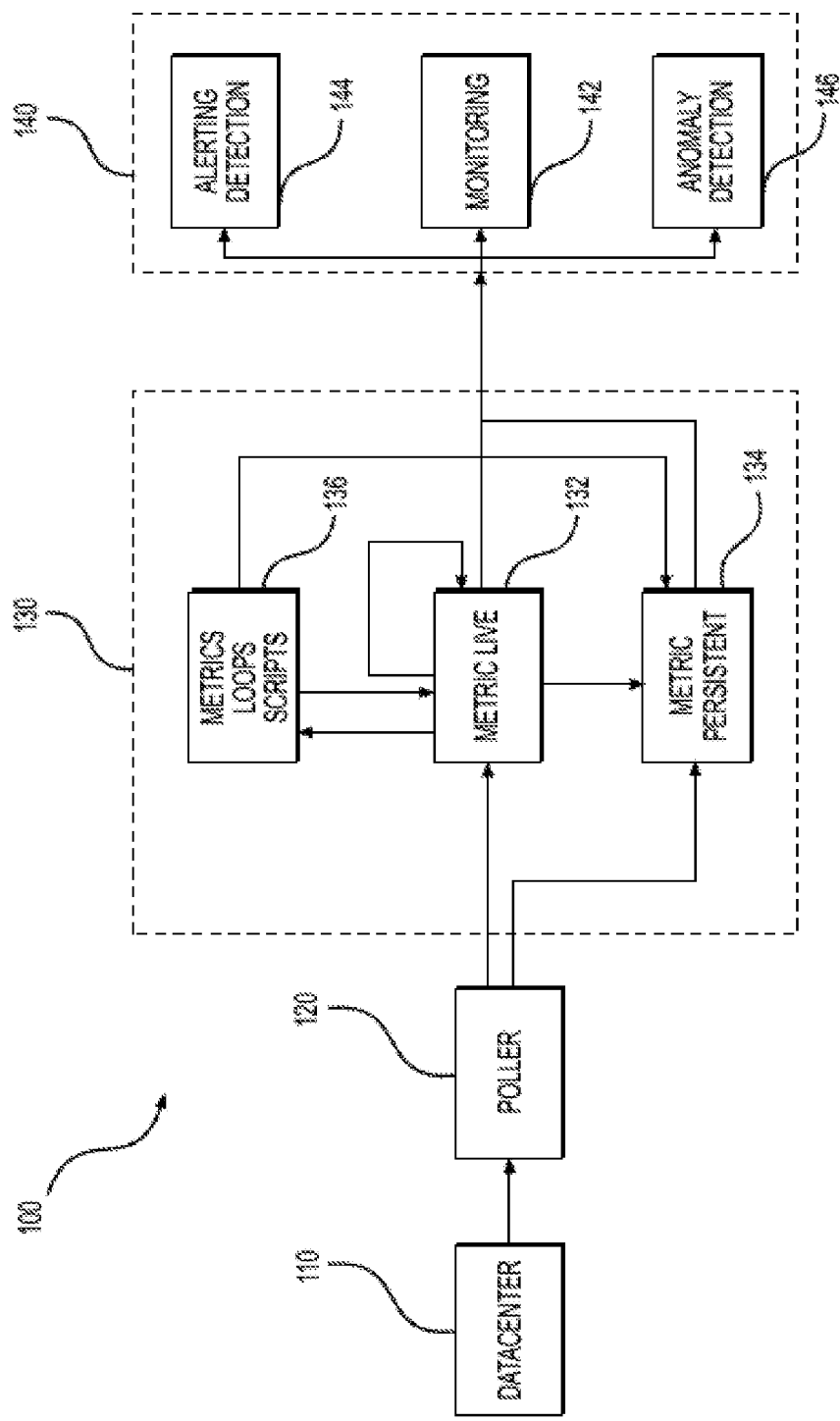
FIG. 1 is a schematic representation of an architecture for collecting metrics from servers of a datacenter in accordance with an embodiment of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology and are included within its scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes that may be substantially represented in non-transitory computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

In an aspect, the present technology, data in the form of measurements related to an operational parameter of a server in a datacenter is collected in view of detecting faults and to anticipate potential hardware defects before they occur, preventing potential impacts on the quality of service provided to a client hosted on the server. A large datacenter may comprise a heterogeneous variety of servers that contain motherboards originating from different manufacturers. Data related to the health of a server may be presented in various forms depending of the motherboard manufacturer. The present technology may periodically collect data from each server of a datacenter or from a complete service infrastructure that may comprise a plurality of datacenters distributed worldwide. An intelligent platform management interface (IPMI) protocol may be used to collect the data despite possible internal differences in the construction of these heterogeneous servers. This collection is made using a scalable polling process in which the servers of a datacenter are assembled in clusters and pollers are assigned to collect the data from each server of a given cluster.

Measurement data may be collected, for example, once per minute from a sensor of each server. The measurement data may be received from heterogeneous servers, in which case they may be presented in various formats that do not allow for a direct comparison and/or aggregation of information related to the various servers. Therefore, the measurement data may be consolidated, or normalized, on the basis of a classification for each type of server present in the datacenter. Following this consolidation, a measurement value obtained from a server of a first type may be directly compared to, or aggregated with, a measurement value obtained from a server of a second type. This consolidation may not be necessary in some cases, for example when it is desired to compare or to aggregate measurement values obtained from a homogeneous group of servers. Regardless, the measurement data, having possibly been consolidated, is then stored in a metrics database. In an aspect, the metrics database may include a cache having a limited retention time, for example one week, and a persistent storage capable of retaining information for an extended period.

With these fundamentals in place, we will now consider some non-limiting examples to illustrate various implementations of aspects of the present technology.

FIG. 1 is a schematic representation of an architecture for collecting metrics from servers of a datacenter in accordance with an embodiment of the present technology. In a non-limiting embodiment, an architecture 100 comprises a datacenter 110 that contains a plurality of servers (shown on later Figures). The datacenter 110 provides a list of the servers to a polling node 120 or to a plurality of polling nodes (only one is shown in order to simplify the illustration). The polling node 120 periodically sends measurement requests to the each of the servers of the datacenter 110. The polling node 120 is connected to a metric platform 130 that includes a live metric storage 132 and a persistent metric storage 134 that both store responses to the measurement requests received from each of the servers of the datacenter 110. The live metric storage 132 is used for short-term collection of measurement information from the servers and for rapid access of the measurement information for analysis purposes. The live metric storage 132 may for example retain the measurement information for a one-week period. The persistent metric storage 134 may retain specific measurement information for an extended period. The live metric storage 132 and the persistent metric storage 134 may acquire metrics from a metrics loops scripts function 136 of the metric platform 130. These scripts are periodically executed in the metric platform 130 to create metric aggregation data series that are stored in the live metric storage 132 and/or in the persistent metric storage 134 may be provided to an analysis function 140 that executes a continuous monitoring 142 of the measurements. The analysis and monitoring may lead to the generation of alerts 144 and/or to the detection of anomalies 146 in view of initiating corrective actions. The alerts 144 may be presented in text or graphical form.

Figure 2:
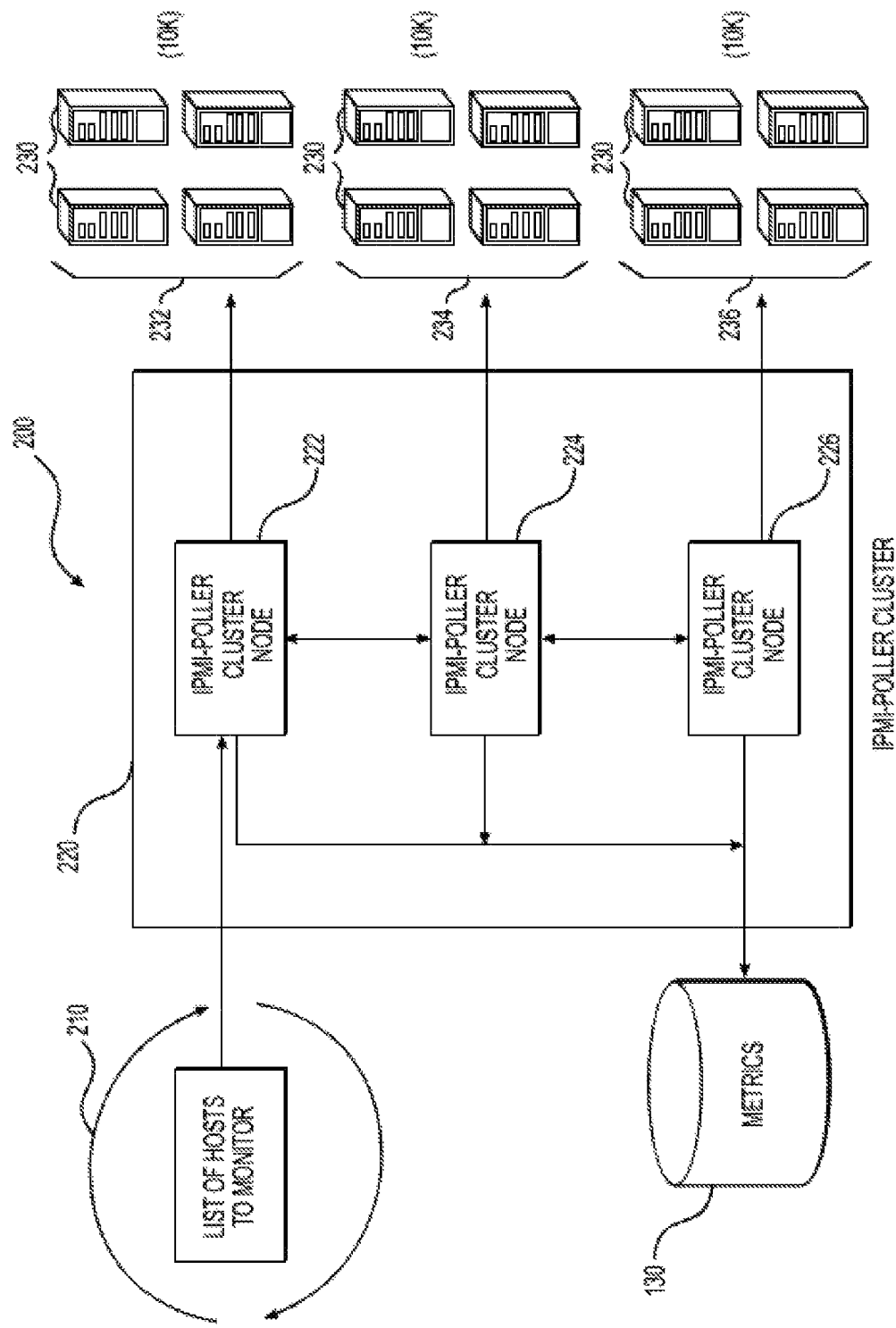
FIG. 2 is a schematic representation of a clustering process for collecting metrics from the servers of the datacenter in accordance with an embodiment of the present technology.

FIG. 2 is a schematic representation of a clustering process for collecting metrics from the servers of the datacenter in accordance with an embodiment of the present technology. A clustering function 200 shows that a list 210 of the servers (also called "hosts") contained in the datacenter 110 (FIG. 1) is provided to a cluster architecture 220. The cluster architecture 220 may implement an intelligent platform management interface (IPMI) protocol for communicating with a plurality of polling nodes 222, 224 and 226 (many more clusters may be defined), each of which correspond to the polling node 120 (FIG. 1), that are each tasked with sending measurement requests to groups 232, 234 and 236 of servers 230. In a non-limiting example, each group (or cluster) 232, 234 and 236 may comprise 10,000 servers 230.

The list 210 of servers of the datacenter 110 may vary over time as new servers 230 are put in service and as other servers are stopped in response to failures, for maintenance purposes or for decommissioning. The cluster architecture 220 may reassign some of the servers 230 between the groups 232, 234 and 236 in order to balance a load of the various polling nodes 222, 224 and 226. Measurements provided by the servers 230 are stored in the metrics cache 130 introduced in the description of FIG. 1.

Figure 3:
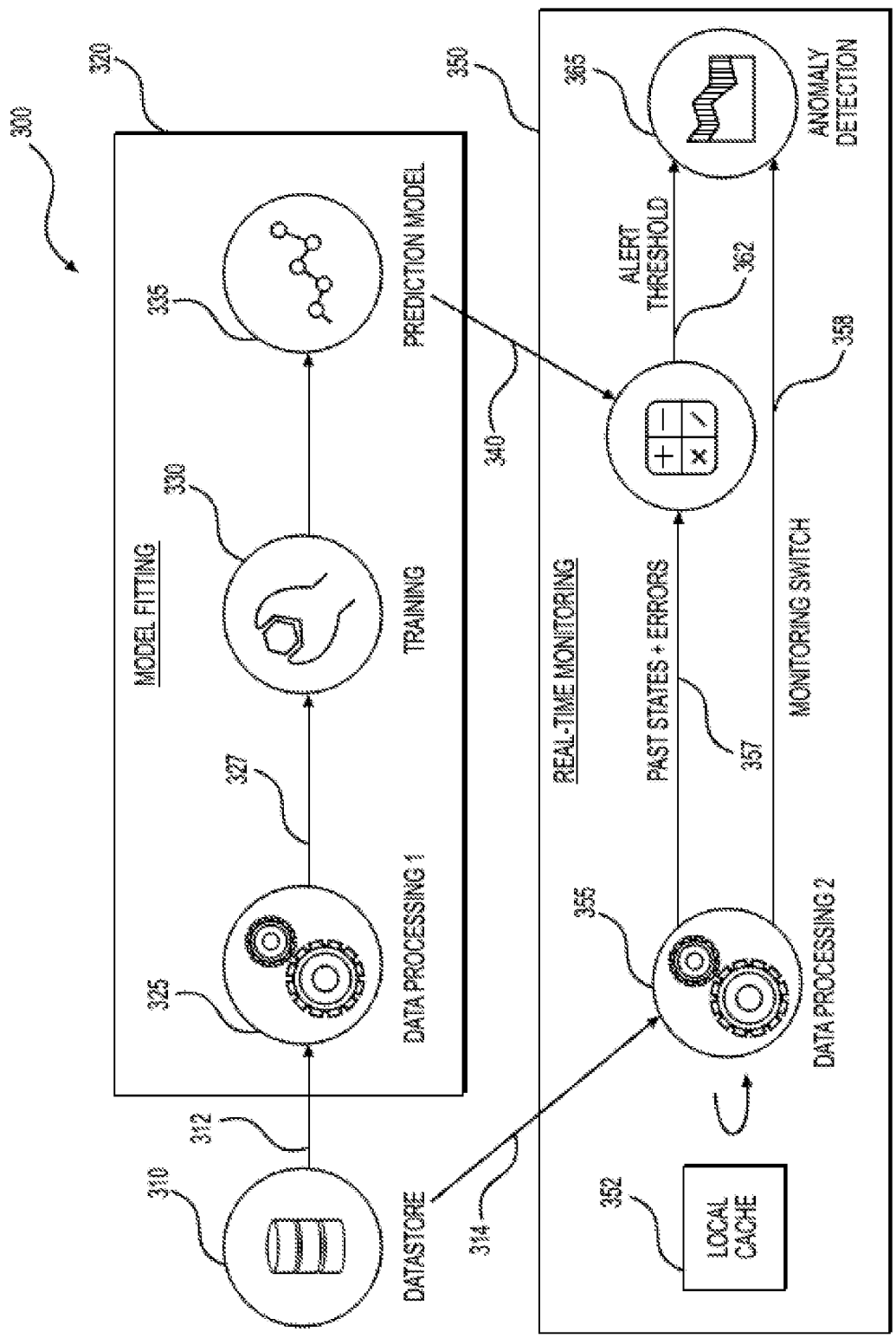
FIG. 3 is a flow diagram illustrating a machine learning process for detecting anomalies in servers of the datacenter in accordance with an embodiment of the present technology.

FIG. 3 is a flow diagram illustrating a machine learning process for detecting anomalies in servers of the datacenter in accordance with an embodiment of the present technology. A machine learning process 300 applies measurement information, stored in a database 310, to two (2) complementary processes, including a model fitting process 320 and a real-time monitoring process 350.

The model fitting process 320 comprises a first data processing function 325 that sorts accumulated measurement information 312 fetched from the database 310. This measurement information 312 may comprise measurements reported from the servers 230 at a relatively low rate, for example once per hour, and accumulated in the database 310 over an extended period, for example over a month. The first data processing function 325 may for example filter, sort, and/or aggregate measurements being part of the measurement information, using scripts defined by the metrics loops scripts function 136 (FIG. 1). Then, the processed measurement information 327 is used as ground truth information in a training function 330 for a machine learning system. The machine learning system, once trained, constructs a prediction model 335 that can provide a raw forecast 340 of future values for the measurement information. In an aspect, a prediction model 335 may be constructed for each server 230 of the datacenter 110 or for a group of servers 230, for example for all servers assembled in a same rack or in a same room of the datacenter 110.

The real-time monitoring process 350 fetches latest measurements 314 obtained from the servers 230 and may keep them in a local cache 352 for rapid access. Each server 230 may provide a latest measurement at a high rate, for example once per minute. A second data processing function 355 calculates past states and errors 357 between the latest measurements and the raw forecast 340 provided by the prediction model 335. These past states and errors 357 are used to update the prediction model 335.

In an embodiment, the prediction model 335 is constructed at fixed intervals, for example every day, every few days, every few weeks, and the like. The raw forecast 340 is then updated, from time to time or on a continuous basis, by calculating a moving average based on past estimation errors, which are differences between past estimates obtained using the raw forecast 340 and past real measurements that may be stored in the local cache 352. Instead or in addition, it is contemplated that models such as seasonal autoregressive integrated moving average (SARIMA) or Holt-Winters may be used to extract fitted autoregressive, moving average and integration parameters and time-polynomial trend to yield a state-space representation of the prediction model. These parameters may then be applied to latest received measurements to obtain a dynamic forecast. The prediction model 335 is gradually updated to follow a trend of the measurements over time. In the same or another embodiment, the machine learning system may be retrained using recent measurements when it is found that the prediction model 335, although updated based on latest measurements, consistently provides estimates that fail to predict the actual measurements.

Alert thresholds 362 are calculated based on current predicted and predetermined safety margins applied to the predicted values. An anomaly detection function 365 may raise an alert, or initiate a corrective action, when the latest measurement for a server 230 or when an aggregated measurement for a group of servers 230 diverges from a corresponding alert threshold.

The second data processing function 355 may dynamically detect a change of a condition of the datacenter 110 or of some of its servers 230. The second data processing function 355 may also dynamically detect a measurement data collection problem. These events could potentially affect the accuracy of the prediction model for one or more impacted servers 230. In response to these events, the second data processing function 355 may issue a monitoring switch signal 358 to prevent an action of the anomaly detection function 365 for the one or more impacted servers 230. Otherwise stated, the second data processing function 355 may detect that the prediction model can no longer be relied on and cause the anomaly detection function 365 to revert to other anomaly detection mechanisms, for example by comparing the latest measurements 314 to fixed thresholds, detecting and anomaly when a threshold is exceeded for a predetermined time period such as a few hours, or detecting an anomaly when a threshold is exceeded for at least a number of servers 230.

On FIG. 3, the machine learning system is unsupervised and may detect most real anomalies but might also detect false anomalies. The machine learning system may become supervised by collecting and post-processing the detected anomalies in order to enrich the prediction model with correlation information related to the actual validity of the detected anomalies.

Figure 4:
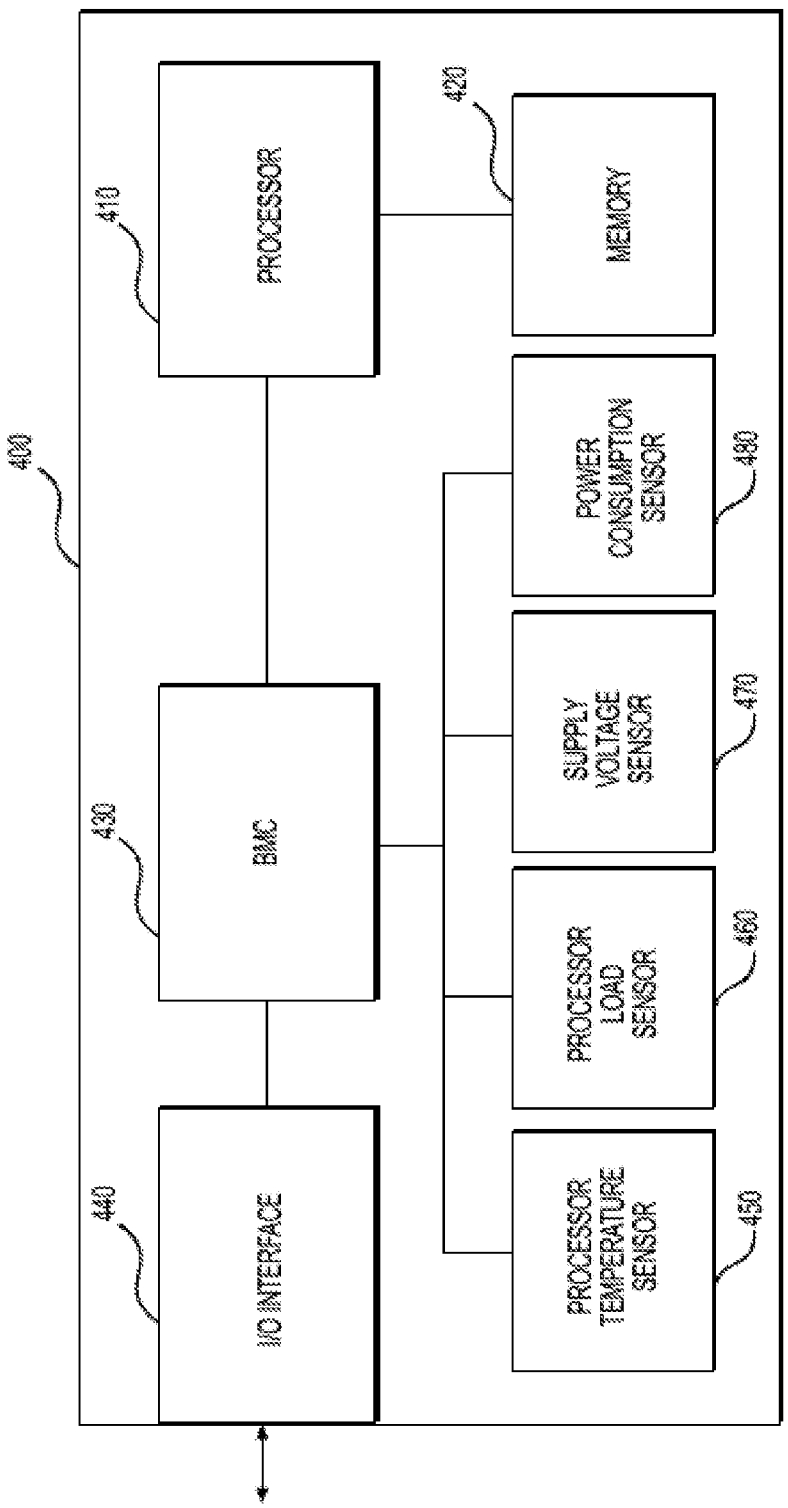
FIG. 4 is a simplified block diagram of a server in accordance with an embodiment of the present technology.

FIG. 4 is a simplified block diagram of a server in accordance with an embodiment of the present technology. A server 400 comprises a processor or a plurality of cooperating processors (one processor 410 is shown for simplicity), one or more memory devices (one memory device 420 is shown for simplicity), a board management controller (BMC) 430, an input/output (I/O) interface 440, and one or more sensors, for example a processor temperature sensor 450, a supply voltage sensor 470, a power consumption sensor 480, and a processor load sensor 460. In an embodiment, a function equivalent to that of the processor load sensor 460 may be realized as a software agent running on the processor 410. Other sensors may also be present to provide measurements of various operational parameters of the server 400 and, in particular, of the processor 410, of the memory device 420 and/or of the I/O interface 440. The processor 410, the memory device 420, the BMC 430, the I/O interface 440 and at least some of the sensors 450, 460, 470 and/or 480 may be mounted on a motherboard (not shown). The server 400 may comprise additional components; FIG. 4 is simplified for ease of illustration. The processor 410 generally handles hosted services for the benefit of a client of a datacenter. The processor 410 may read and write data from and to the memory device 420. The input/output interface 440 allows the server 400 to communicate with external entities, for example with a device (not shown) of the client or with other servers allocated to the same client. The I/O interface 440 also allows the server 400 to communicate with various components of the datacenter (FIG. 5).

The BMC 430, sometimes called a service processor, handles communications between the processor 410 and entities external to the server 400 and may also handle conventional maintenance functions and firmware updates for the server 400. The BMC 430 may support the IPMI protocol. In particular, requests for measurements from one or more of the sensors 450, 460, 470 and/or 480 may be received at the I/O interface 440. These requests are handled by the BMC 430 that fetches the measurements from the sensors 450, 460, 470 and/or 480 through the processor 410 and responds to the measurement requests while limiting an additional load imposed on the processor 410 and without causing any intrusion in the software or operating system running on the processor 410.

Figure 5:
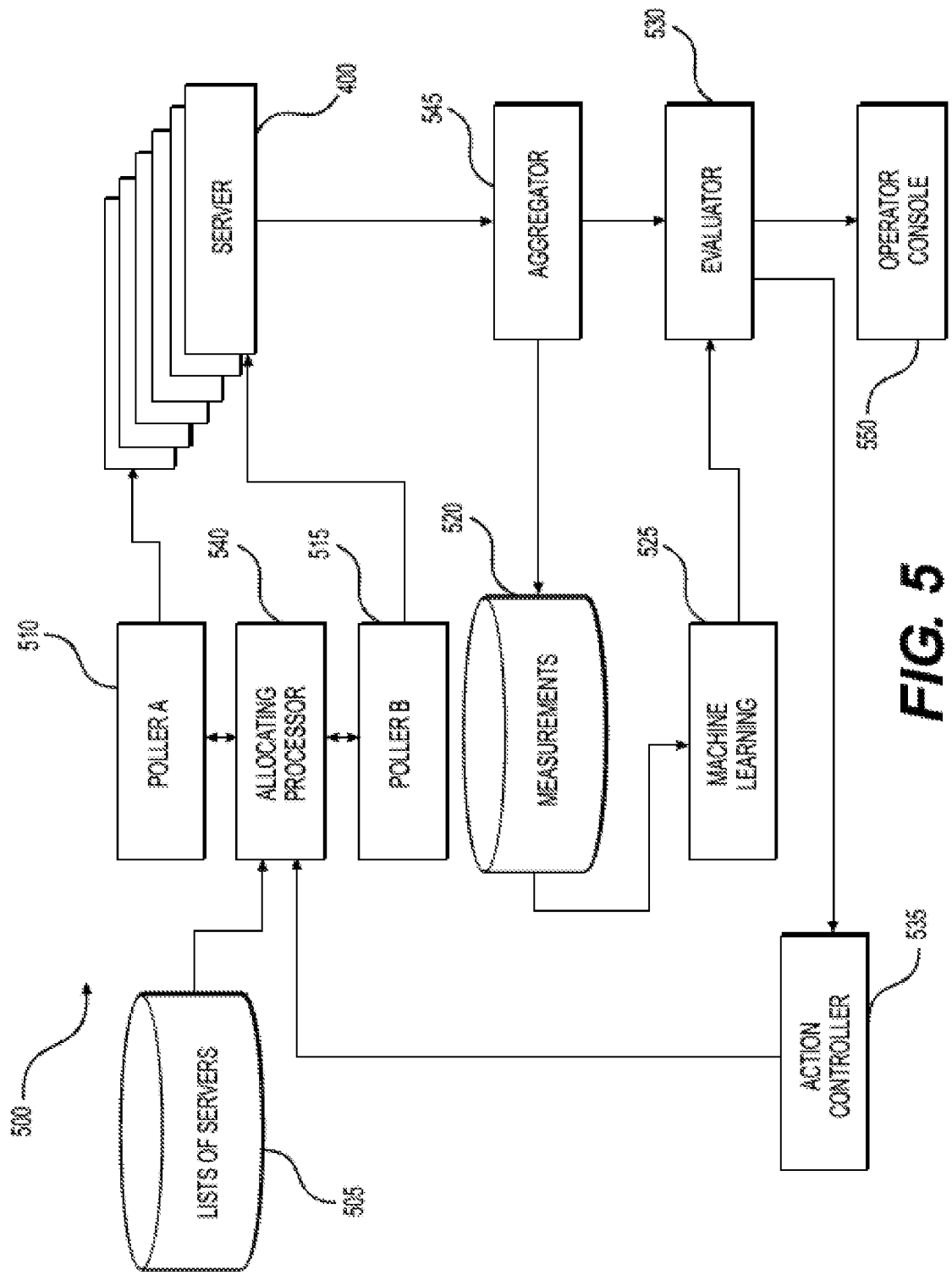
FIG. 5 is a block diagram of a datacenter in accordance with an embodiment of the present technology.

FIG. 5 is a block diagram of a datacenter in accordance with an embodiment of the present technology. A datacenter 500 comprises a server infrastructure, which includes a plurality of servers 400, as well as a system for supervising a health of the server infrastructure. The system comprises a repository 505, at least one polling node (poller A 510 and poller B 515 are shown), a database 520, a machine learning system 525, an evaluator 530, an action controller 535, and may further comprise an allocating processor 540, an aggregator 545 and an operator console 550. Each server 400 comprises at least one sensor (shown on FIG. 5) that provides measurements related to a parameter of the server 400. The repository 505 stores identities of each of the servers 400. The polling node 510 acquires a list of servers from the repository 505 and sends, at each of successive polling periods, a measurement request to each server 400 of the list of servers. As expressed in the description of FIG. 4, each server 400 comprises a BMC 430 that provides measurements of one or more operational parameters of the server 400, for example operational parameter of the processor 410 in the server 400. Therefore, each server 400 sends measurements at each of the successive polling periods in response to the measurement requests. These measurements are received, either at the polling node 510 or directly at the database 520, and stored in the database 520.

Optionally, each measurement received from the various servers 400 may carry an identifier of a client hosted on the server. The identifier may be stored in the database 520 in relation to the measurement. Accordingly, it may be possible to present measurement information for the client on the operator console 550. In case a new measurement received from a given server 400 carries a new client identifier, the database 520 detects that the given server 400 has been reallocated to a new client. In such case, a relation between the identifier for a previous client hosted the given server 400 and measurements for that given server 400 is deleted in the database 520. Any previously stored measurement information for the given server 400 can no longer be associated with the previous client.

The machine learning system 525 reads the stored measurements for each respective server 400 from the database 520 and constructs a prediction model for each respective server 400 based on the stored measurements for the respective server 400.

The evaluator 530 may then receive a latest measurement from a given server 400, fetch the prediction model for the given server 400 from the machine learning system 525, and evaluate a compliance of the latest measurement with the prediction model for the given server. The action controller 535 may then receive a compliance result for the given server 400 from the evaluator 530 and take a corrective action for the given server 400 if the latest measurement does not comply with the prediction model for the given server 400.

In an embodiment, the datacenter 500 comprises two or more polling nodes; it is to be understood that the datacenter 500 may actually comprise a large number of polling nodes. The list of servers from the repository 505 is split by the allocating processor 540 into distinct lists of servers supplied to each of the polling nodes 510 and 515. In a non-limiting example, each polling node may be tasked with concurrently polling up to 10,000 servers 400.

The allocating processor 540 may operate as a load-balancing processor to equitably assign the task of polling the servers 400 to the polling nodes 510 and 515. Alternatively or in addition, the poller A 510 may implement a first polling interval and the poller B 515 may implement a second polling interval shorter than the first polling interval. One possible corrective action taken by the controller 535 when it detects a non-compliance on a given server 400 that has previously been polled by the poller A 510 may be to cause the allocating processor 540 to move the given server 400 to the list of servers polled by the poller B 515. As a result, the given server 400 will now be polled at a faster rate for enhanced monitoring.

Other actions that the action controller 535 may take when detecting that a latest measurement for a given server 400 does not comply with the corresponding prediction model comprises providing a command causing any one or more of reducing a processing speed of the given server 400, reducing a processing power of the given server 400, reducing a traffic load directed to the given server 400, transferring a virtual machine from the given server 400 to another server, and/or increasing a capacity of a cooling system for the given server 400.

In an embodiment, the evaluator 530 may cause the operator console 550 to issue an alert indicative of the compliance result for a given server 400 if a latest measurement from the given server 400 does not comply with the corresponding prediction model. Whether or not the latest measurement complies with the prediction model for the given server 400, the evaluator 530 may provide the measurements and various results of its evaluation to the operation console 500 for graphical presentation purposes.

In the datacenter 500, the servers 400 are usually assembled in racks (not shown) and a plurality of racks are usually installed in one or more rooms (not shown). In a non-limiting example, a rack may contain between 48 and 96 servers. In the same or another non-limiting example, depending of the datacenter architecture and on server types, a room may contain up to 200 racks. In the same or another non-limiting example, the datacenter 500 may contain up to 10 rooms. Problems related to a lack of sufficient cooling or to power consumption such as those caused by an improper supply voltage, as well as other problems, may impact a single server 400, impact all servers in a rack, impact all servers assembled in a room, or impact the whole datacenter 500.

A temperature of a rack may be defined as an aggregation of processor temperatures of all servers 400 contained in the rack. Likewise, a temperature of a room may be defined as an aggregation of processor temperatures of all servers 400 contained in the room. Generally speaking, the temperature of a rack or the temperature of a room may fluctuate at a lower rate than the processor temperature of a single server 400, particularly when only one or a few servers 400 is impacted by a troublesome condition. However, a rapid change of the temperature for a rack as a whole or for a room as a whole may reflect a particularly dangerous condition that may impact the quality of service for a large number of clients. This may be the case, for example, upon failure a cooling system used to control the temperatures of all servers 400 in a rack or in a room. For this reason, the present technologies may aggregate measurements provided by servers of a group of servers in view of supervising the health of all servers in a rack, in a room, or in the datacenter 500.

The aggregator 545 may thus aggregate respective measurements received at each given polling period from the servers 400 of a given group, the given group comprising all servers 400 installed in a common rack, in a common room, or in the datacenter 500 as whole. Optionally, prior to aggregating the respective measurements received at each given polling period from the servers 400 of the given group, the aggregator 545 may consolidate, or normalize, the measurements received from various different servers 400 of the given group. This consolidation is made on the basis of a classification for each type of server 400 present in the given group, in view of allowing a direct comparison of these measurements and in view of facilitating their aggregation.

In instead or addition to storing the measurements for each server 400, the database 520 may also store the aggregated measurements for the group. Likewise, instead or in addition to constructing a prediction model for each server 400, the machine learning system 525 may also construct a prediction model for the servers 400 of the given group based on the aggregated measurements. Similarly, instead or in addition to evaluating a compliance of a latest measurement with a corresponding prediction model for each given server 400, the evaluator 530 may also evaluate a compliance of latest aggregated measurements with the prediction model for the servers 400 of the given group. This evaluation made by the evaluation 530 may comprise a definition of a normal variation from the prediction model for the given group of servers 400 and a determination that the latest aggregated measurements comply with the prediction model for the given group of servers 400 if a difference between the latest aggregated measurements and a corresponding value defined by the prediction model for the given group of servers 400 is less than or equal to the normal variation.

The evaluator 530 may inform the action controller 535 and/or the operator console 550 of a non-compliance at the level of the given group of servers 400. A corrective action may be taken at a level of the given group of servers 400 and/or an alert may be issued at the same level. Optionally, the action controller 535 may withhold the issuance of separate alerts or corrective actions for each server 400 of a group of servers 400 when an alert is issued or a corrective action is taken for the group of servers 400 as a whole.

The system for supervising the health of the server infrastructure and its components, including the repository 505, the at least one polling node (poller A 510 and poller B 515 are shown), the database 520, the machine learning system 525, the evaluator 530, the action controller 535, the allocating processor 540, the aggregator 545 and the operator console 550, are shown on FIG. 5 and described hereinabove as being part of the datacenter 500. In an embodiment, the system for supervising the health of the server infrastructure may be understood as being external from the datacenter 500 and may be capable of communicating with a plurality of datacenters for supervising the health of server infrastructures in each of the datacenters. As such, the repository 505 may contain lists of servers of each datacenter of the plurality of datacenters, the polling nodes 510 and 515 may send measurement requests to servers of each list of servers, the database 520 may store measurements received from servers of the plurality of datacenters, and so on.

Figure 6A:
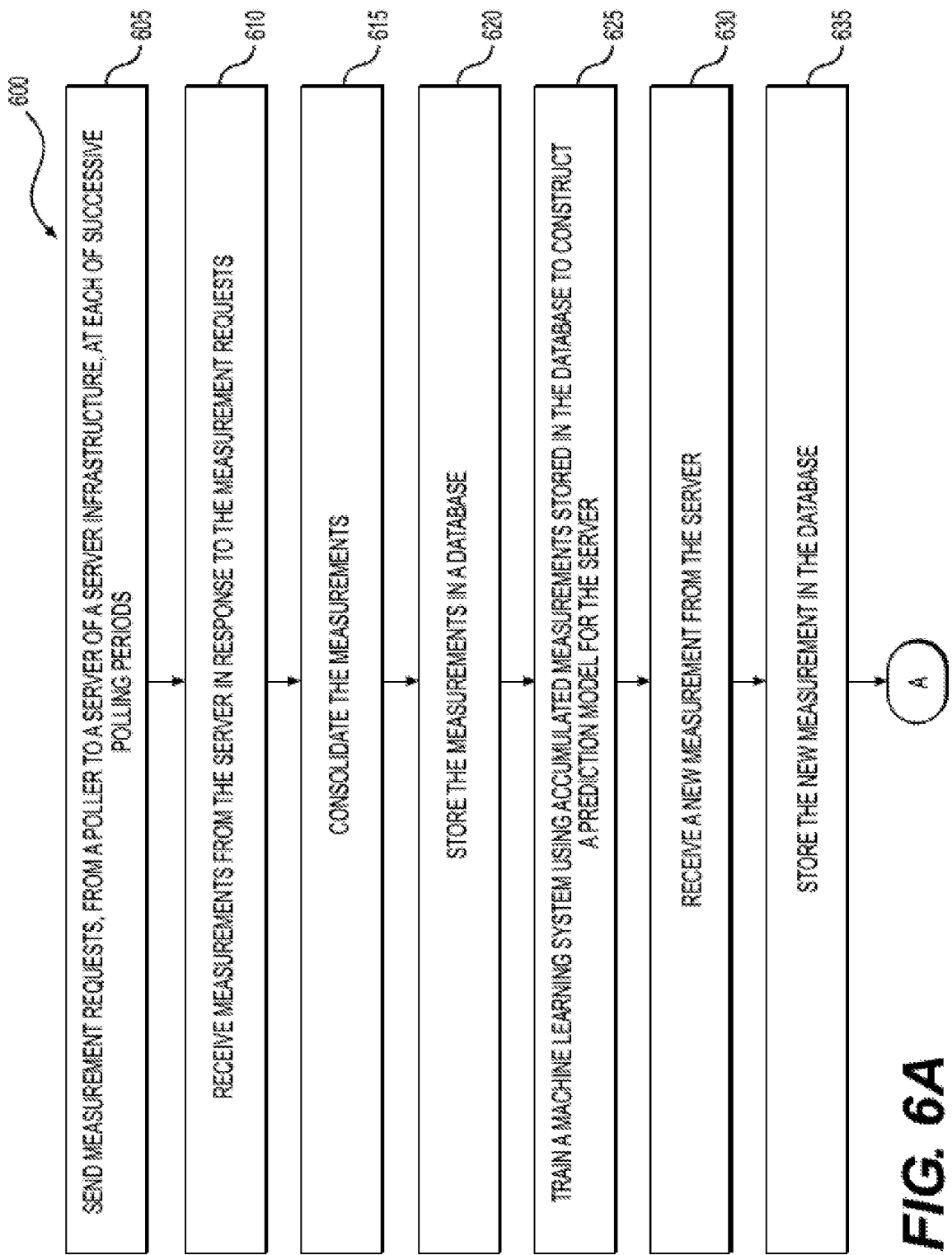
FIGS. 6a, 6b and 6c contain a sequence diagram showing operations of a method for supervising a health of a server infrastructure in accordance with an embodiment of the present technology.
Figure 6B:
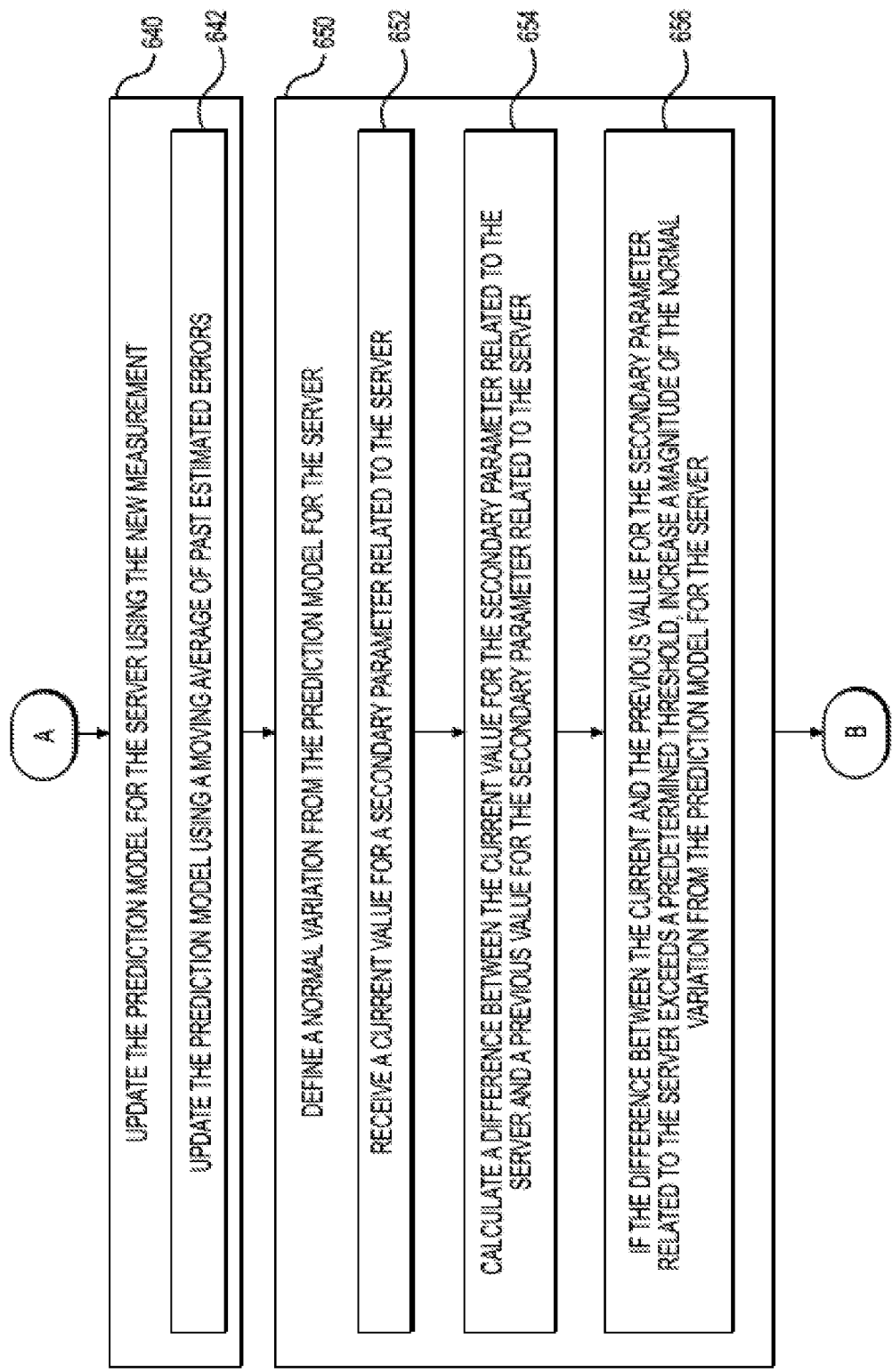
Figure 6C:
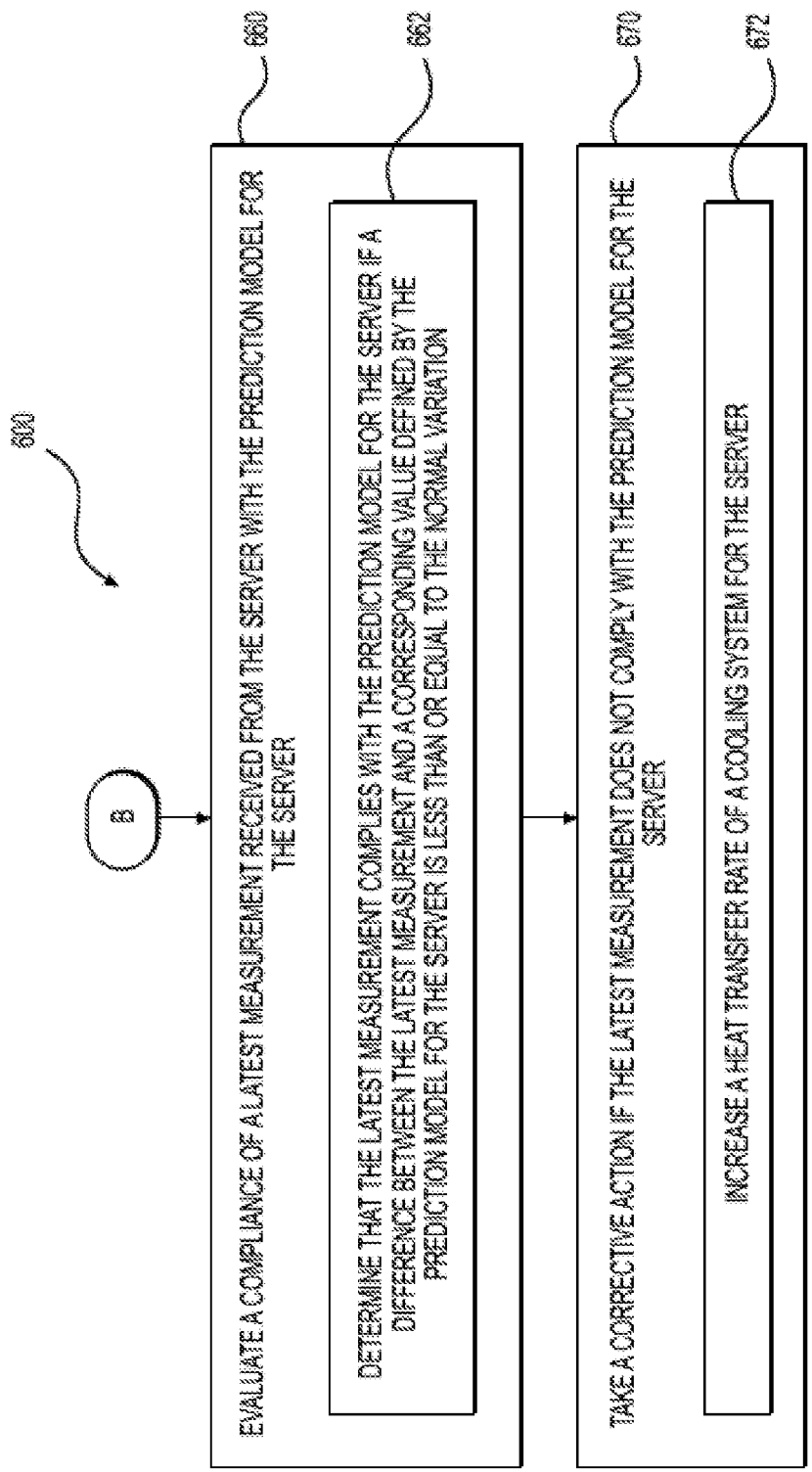

FIGS. 6a, 6b and 6c contain a sequence diagram showing operations of a method for supervising a health of a server infrastructure in accordance with an embodiment of the present technology. On FIGS. 6, 6b and 6c, a sequence 600 comprises a plurality of operations, some of which may be executed in variable order, some of the operations possibly being executed concurrently, some of the operations being optional. In the sequence 600, at least one of the polling nodes 510, 515 sends measurement requests to at least one given server 400 of the server infrastructure, at each of successive polling periods, at operation 605. The given server 400 responds with measurements that are received at operation 610, either at the polling node 510 or 515, or directly at the database 620. The measurements may be consolidated, or normalized, at operation 615. Then at operation 620, the database 520 stores the measurements received from the given server 400 in response to the measurement requests. In an embodiment, the measurement requests and signals carrying the measurements are exchanged between the at least one polling node 510 and/or 515, the given server 400 and the database 520 using the IPMI protocol.

At operation 625, the machine learning system 525 is trained using accumulated measurements stored in the database 520 for the given server 400 in order to construct a prediction model for the given server 400. In an embodiment, measurements may be accumulated for some time prior to the training of the machine learning system 525, and the prediction model for the given server 400 may be construed as a cold model. In the same or other embodiments, the machine learning system 525 may detect and ignore outliers in the accumulated measurements, for example measurements that are outside of an $i^{th}$ percentile of measurements accumulated over a period of one hour, a value i for the percentile being a number less than 100, for example 70 percent. In the same or other embodiments, the machine learning system 525 may construct the prediction model by applying, on the stored measurements, a forecasting algorithm such as, for example, an autoregressive integrated moving average (ARIMA), a triple exponential smoothing (Holt-Winters), a Fast Fourier transform (FFT) decomposition, a current state redefinition, a polynomial combination, a linear regression, a multilayer perceptron (MLP), a long short-term memory (LSTM), and a Gaussian distribution.

A new measurement is received from the given server 400 at operation 630. This new measurement is stored in the database 520 at operation 635. The prediction model is updated using the new measurement at operation 640. Operation 640 may comprise sub-operation 642, in which the prediction model is updated using a moving average of past estimation errors.

A normal variation from the prediction model for the given server 400 may be defined at operation 650. Various techniques may be used to define this normal variation. Generally speaking, the normal variation and a calculation method therefor are selected based on a compromise between a responsiveness of the monitoring and a need to minimize a number of unnecessary non-compliance detections. In an embodiment, the normal variation from the prediction model for the given server 400 is defined according to a $k^{th}$ percentile of differences between measurements stored over a predetermined timeframe ending at the present time, for example over the last two (3) days, and corresponding values defined by the prediction model for the given server 400. In this case, a value k for the percentile is a number less than 100. In another embodiment, the normal variation from the prediction model for the given server 400 is defined according to a predetermined $n^{th}$ multiple of an average of differences between measurements stored over a predetermined timeframe ending at the present time and corresponding values defined by the prediction model for the given server 400. In a non-limiting example, the variation may be considered normal when it does not exceed four (4) times the average of the differences.

Alternatively or in addition, operation 650 may comprise sub-operations 652, 654 and 656. At sub-operation 652, a current value for a secondary parameter related to the given server 400 is received and stored in the database 520. The secondary parameter may for example be a load on a processor of the given server 400, a power consumption of the processor of the given server 400, a supply voltage to the processor of the given server 400, a flow of a fluid for cooling the processor of the given server 400, a temperature of the fluid for cooling the processor of the given server 400 and an ambient temperature at the given server 400. These values are provided by the various sensors of the given server 400. At sub-operation 654, a difference between the current value for the secondary parameter related to the given server 400 and a previously received value for the secondary parameter related to the given server 400 is calculated. At sub-operation 656, a magnitude of the normal variation from the prediction model for the given server 400 is increased if the difference between the current and the previous value for the secondary parameter related to the given server 400 exceeds a predetermined threshold. An application example of the sub-operations 652, 654 and 656 comprises a situation where the temperature of the processor of the given server 400 has been relatively stable for some time. The prediction model therefore identifies a relatively narrow range of temperature variations. Consequently, the normal variation from the predicted temperature of the processor of the given server 400 is also fairly narrow. The secondary parameter received at sub-operation 652 and evaluated at sub-operation 654 indicates a sudden increase in a load of the processor of the given server 400. It is expected that the temperature of the processor of the given server 400 will rapidly increase and, in response, the magnitude of the normal variation is also increased at sub-operation 656. Over time, the prediction model will be updated at operation 640 (optionally at sub-operation 642) with a suite of new measurements for the temperature of the processor of the given server 400 and a new normal variation will be defined. Another example of a secondary parameter may include a temperature of another component of the given server 400, for temperature of a cooling liquid exiting a cooling device for the processor of the given server 400. Yet another example of a secondary parameter may include a report of a packet loss on the given server 400, this report being an indication of a loss of quality of service on the given server 400.

Regardless, a compliance of a latest measurement received from the given server 400 with the prediction model for the given server 400 is evaluated at operation 660. In an embodiment, operation 660 may include sub-operation 662 in which a determination is made that the latest measurement complies with the prediction model for the given server 400 if a difference between the latest measurement and a corresponding value defined by the prediction model for the given server 400 is less than or equal to the normal variation defined at operation 650.

If the latest measurement does not comply with the prediction model for the given server 400, a correction action is taken at operation 670. Examples of the corrective actions that may be taken comprise one or more of reducing a processing speed of the given server 400, reducing a processing power of the given server 400, reducing a traffic load directed to the given server 400, transferring a virtual machine from the given server 400 to another server, increasing a heat transfer rate of a cooling system for the given server 400, and/or reducing a period for collecting and storing the measurements received from the given server 400.

In an embodiment, the measurements are provided by the processor temperature sensor 450 (FIG. 4) of the given server 400. The prediction model is therefore a prediction of an expected variation of a temperature of the processor 410 over time. In this embodiment, the normal variation comprises a maximum delta above a current temperature defined by the prediction model. The normal variation may also comprise a minimum delta below the current temperature defined by the prediction model for the given server 400. Alternatively, the normal variation may comprise an unlimited delta below the current temperature defined by the prediction model for the given server 400, considering that a low temperature of the processor 410 may be considered harmless. In other words, the evaluation of the compliance of the latest measurement to the prediction model may optionally ignore any temperature value that is below the current temperature defined by the prediction model. In this embodiment, operation 670 may comprise sub-operation 672 in which a heat transfer rate of a cooling system for the given server 400 is increased if the temperature of the processor of the given server 400 is found to exceed a range defined by the prediction model and the normal variation. An increase of the heat transfer rate of the cooling system may be obtained by increasing a flow of air-cooling provided to the given server 400 and/or increasing a flow of liquid cooling provided to a cooling device operatively connected to the given server 400. An increase the flow of air cooling provided to the given server 400 may be obtained by opening a ventilation inlet, opening a ventilation outlet, starting one or more fans, and/or increasing a fan speed, the ventilation inlet, the ventilation outlet, the one or more fans being part of the given server 400 or operatively connected to the given server 400.

The sequence 600 of FIG. 6 has been described primarily in the context where one given server 400 provides measurements to the database 520 and to the evaluator 530, so that the machine learning system 525 constructs a prediction model for the one given server 400 and the evaluator 530 evaluates a compliance of a latest measurement received from the one given server 400 with the corresponding prediction model. The sequence 600 may comprise sending measurement requests from the one or more polling nodes 510 and 515 to a plurality of servers 400 or to all servers 400 of the service infrastructure. The database 520 may thus store respective measurements received from each of the plurality of servers 400 at each of the successive polling periods. The machine learning system 520 may be trained using the respective stored measurements to construct a prediction model for each of the plurality of servers 400. The evaluator 530 may evaluate a compliance of measurements received from each of the servers 400 to the corresponding prediction models and the action controller 535 may take appropriate corrective actions for any one of the servers 400.

Figure 7A:
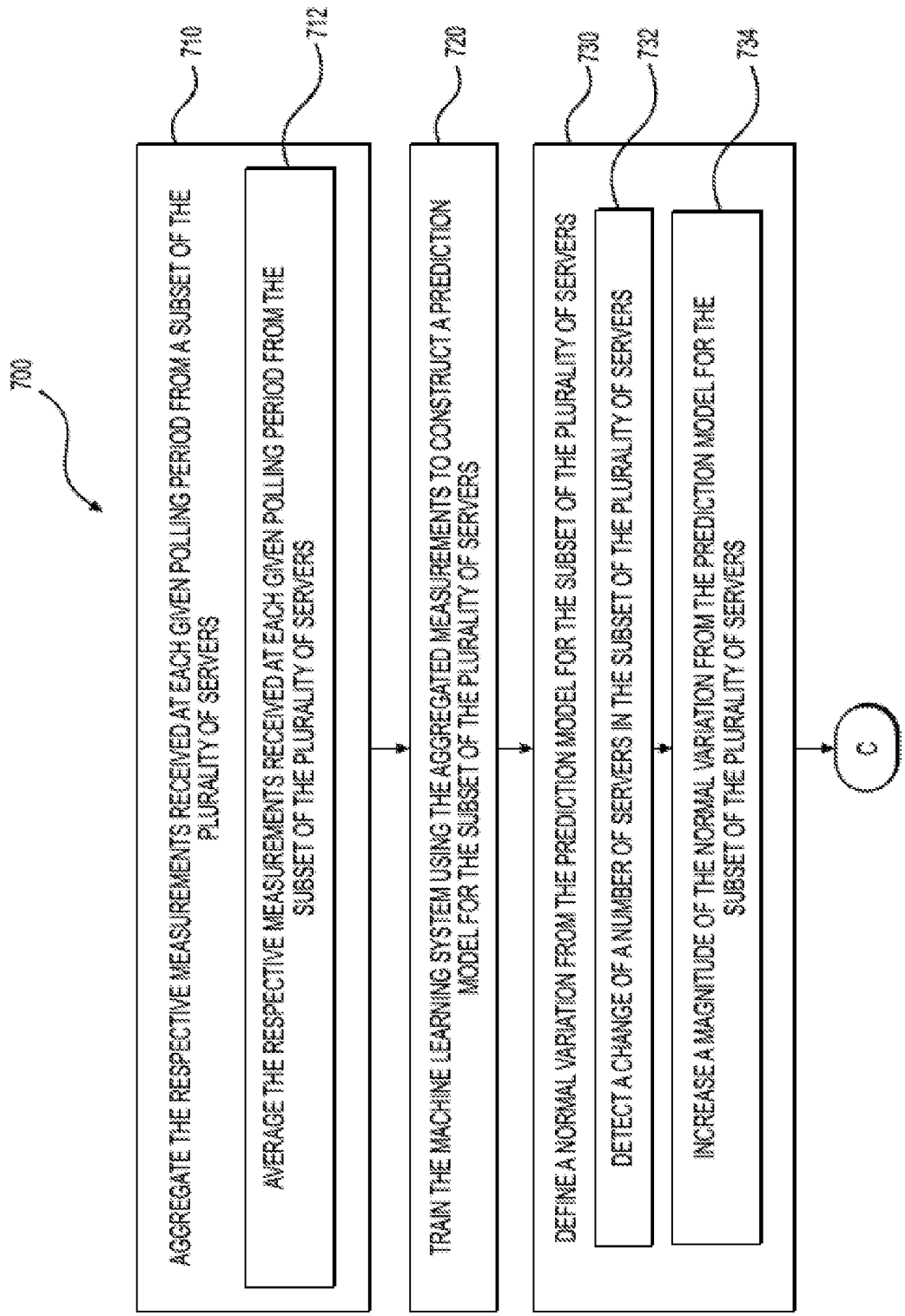
FIGS. 7a and 7b contain a sequence diagram showing operations of a method for supervising a health of an aggregated group of servers in accordance with an embodiment of the present technology.
Figure 7B:
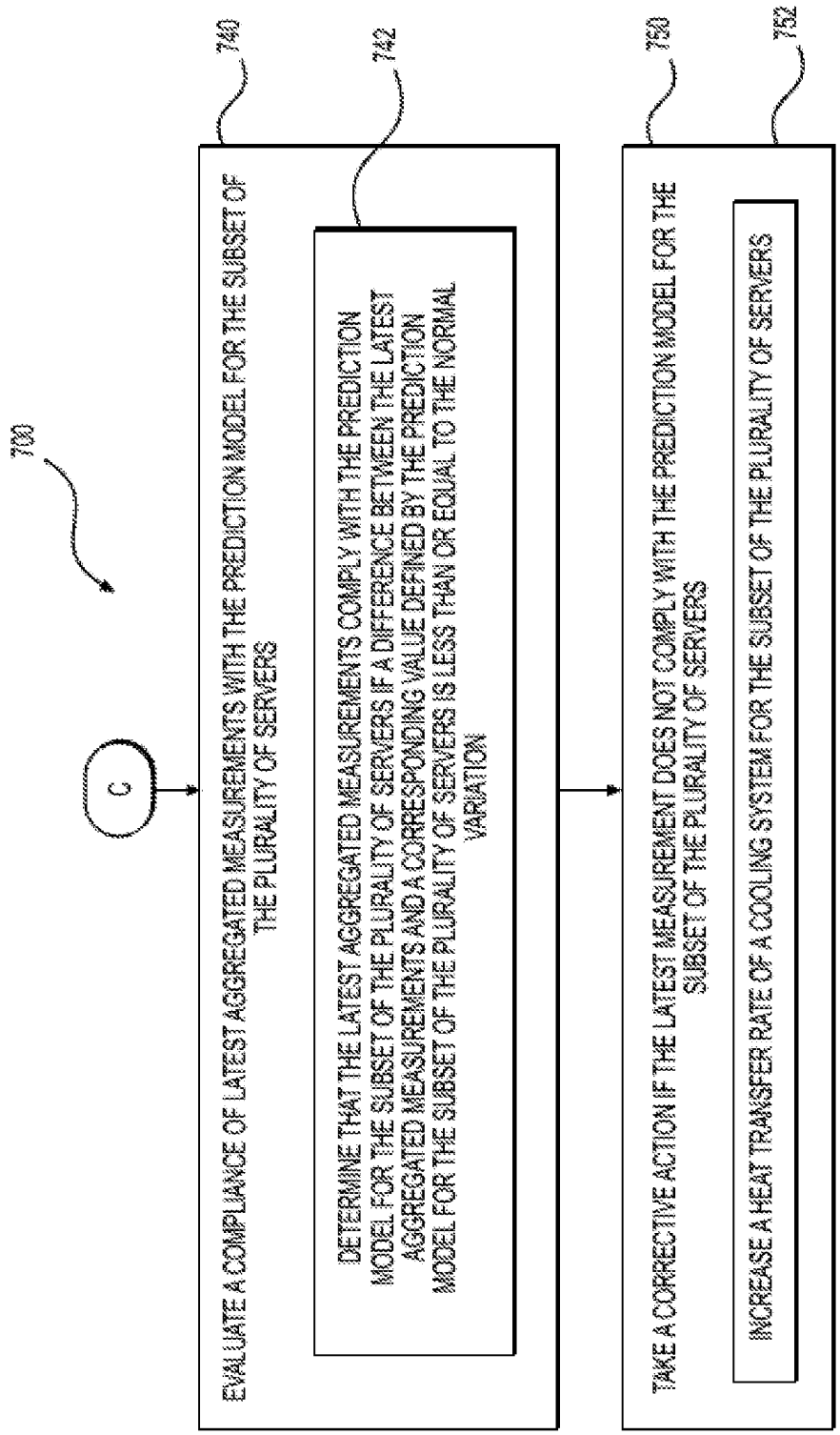

As previously mentioned, problems related to a lack of sufficient cooling or to an improper supply voltage, as well as other problems, may impact a single server 400, impact all servers in a rack, impact all servers assembled in a room, or impact the whole datacenter 500 and, the present technologies may aggregate measurements provided by servers of a group of servers in view of supervising the health of all servers in a rack, in a room, or in the datacenter 500. To this end, FIGS. 7a and 7b contain a sequence diagram showing operations of a method for supervising a health of an aggregated group of servers in accordance with an embodiment of the present technology. On FIGS. 7a and 7b, a sequence 700 comprises a plurality of operations, some of which may be executed in variable order, some of the operations possibly being executed concurrently, some of the operations being optional. In the sequence 700, operation 710 comprises aggregating, by the aggregator 545, the respective measurements received at each given polling period from a subset of the plurality of servers 400. In an embodiment, the subset of the plurality of servers 400 comprises all servers 400 installed on a same rack. In another embodiment, the subset of the plurality of servers 400 comprises all servers 400 installed on a same room. In yet another embodiment, the subset of the plurality of servers 400 comprises all servers 400 installed in the datacenter 500. In a still further embodiment, the aggregator 545 may be configured to support any one or more of these aggregation levels, as requested by an operator of the datacenter 500. Operation 710 may comprise sub-operation 712 in which the aggregation is made by averaging the respective measurements received at each given polling period from the subset of the plurality of servers 400.

The database 520 stores the aggregated measurements received from the aggregator 545. In an embodiment, the database 520 may store both the aggregated measurements and individual, non-aggregated measurements received from each of the servers 400. Otherwise stated, this embodiment may support both of the sequences 600 and 700.

At operation 720, the machine learning system 525 is trained using the aggregated measurements to construct a prediction model for the subset of the plurality of servers 400.

A normal variation from the prediction model for the subset of the plurality of servers 400 may be defined at operation 730. Various techniques may be used to define this normal variation. In an embodiment, the normal variation from the prediction model for the subset of the plurality of servers 400 is defined according to a $j^{th}$ percentile of differences between aggregated measurements stored over a predetermined timeframe ending at the present time and corresponding values defined by the prediction model for the subset of the plurality of servers 400. In this case, a value j for the percentile is a number less than 100. In another embodiment, the normal variation from the prediction model for the subset of the plurality of servers 400 is defined according to a predetermined $m^{th}$ multiple of an average of differences between aggregated measurements stored over a predetermined timeframe ending at the present time and corresponding values defined by the prediction model for the subset of the plurality of servers 400. In a non-limiting example, the variation may be considered normal when it does not exceed three (3) times the average of the differences. Given that normal variations for the aggregated subset of the plurality of servers 400 may be less that the normal variations for any given server 400 of the subset, the normal variation defined by the prediction model for the subset of the plurality of servers 400 may optionally be defined with a narrower range than a normal variation defined for a particular server 400.

Alternatively or in addition, operation 730 may comprise sub-operations 732 and 734. At sub-operation 732, a change of a number of servers in the subset of the plurality of servers 400 may be detected. Such a change may impact the applicability of previously aggregated measurements to the evaluation of newly aggregated measurements. As a non-limiting example, the subset may include two (2) servers 400 and the previously received measurements may reveal that the processor 450 of a first server 400 is consistently at 20 degrees while the processor 450 of a second server 400 is consistently at 80 degrees, for an aggregated (average) value of 60 degrees. If the first server 400 is taken out of service, the subset now only comprises the second server 400 and its temperature becomes the sole value provided to the aggregator 545 for this subset, yielding an aggregated value of 80 degrees. The sudden change of the aggregated temperature value from 60 to 80 degrees might be perceived as a problematic situation for the subset while, in reality, the previously aggregated measurement no longer provides an accurate basis for evaluation of the new aggregated value. Consequently, in order to prevent a corrective action that could be caused by a change of the composition of the subset of servers 400 rather than by an actual problematic condition within the subset of servers 400, sub-operation 734 may comprise increasing a magnitude of the normal variation from the prediction model for the subset of the plurality of servers 400 following the detection made at sub-operation 732 of the change of the number of servers 400 in the subset. As ongoing measurements received from the subset of servers 400 continue being aggregated by the aggregator 545, the machine learning system 525 will gradually adjust the prediction model for the subset of servers 400.

Although not shown on FIG. 7, a change in a secondary parameters related to the subset of servers 400 may also impact the determination of the normal variation from the prediction model for the subset of the plurality of servers 400 at operation 730. The secondary parameter may for example be a power consumption of a rack or a room comprising the subset of servers 400, a power supply voltage for the rack or room, a flow of a cooling fluid delivered to the rack or room, a temperature of the cooling fluid delivered to the rack or room and an ambient temperature in the rack or room.

Regardless, operation 740 comprises evaluating, by the evaluator 530, a compliance of latest aggregated measurements with the prediction model for the subset of the plurality of servers 400. Operation 740 may comprise sub-operation 742 for determining that the latest aggregated measurements comply with the prediction model for the subset of the plurality of servers 400 if a difference between the latest aggregated measurements and a corresponding value defined by the prediction model for the subset of the plurality of servers 400 is less than or equal to the normal variation defined at operation 730. A treatment of an eventual non-compliance for the subset of the plurality of servers 400 at operation 750 and sub-operation 752 is similar or equivalent to the treatment of a non-compliance for any particular server, as shown on operations 670 and 672 (FIG. 6c).

Returning to FIG. 5, the datacenter 500 comprises the system for supervising a health of the plurality of servers 400. This system comprises at least the database 520, the machine learning system 525, and the evaluator 530. In turn, the evaluator 530 may comprise one or more processors coupled to one or more memory devices. The one or more memory devices may further comprise non-transitory computer-readable media for storing instructions that are executable by the one or more processors of the evaluator 530 to execute some or all of the operations of the sequence 600 and/or 700.

EXAMPLES

Figure 8:
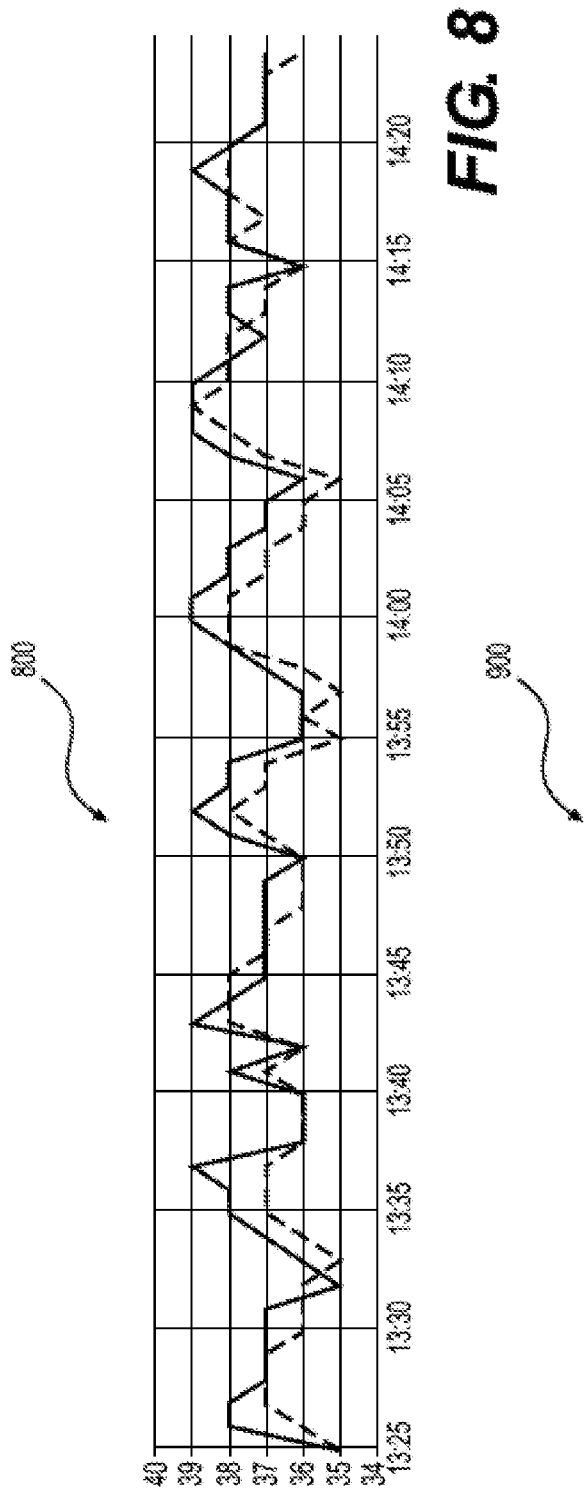
FIG. 8 is a graph showing a variation of two (2) processors of a server in accordance with an embodiment of the present technology.

Various graphs may be presented on the operator console 550. For example, FIG. 8 is a graph showing a variation of two (2) processors of a server in accordance with an embodiment of the present technology. A graph 800 shows a variation of a number of a temperature for two (2) processors 450 of a same server 400 over time. The temperature is expressed on a vertical axis in degrees Celsius and the time is expressed on a horizontal axis in hours and minutes, with a HH:MM format.

Figure 9:
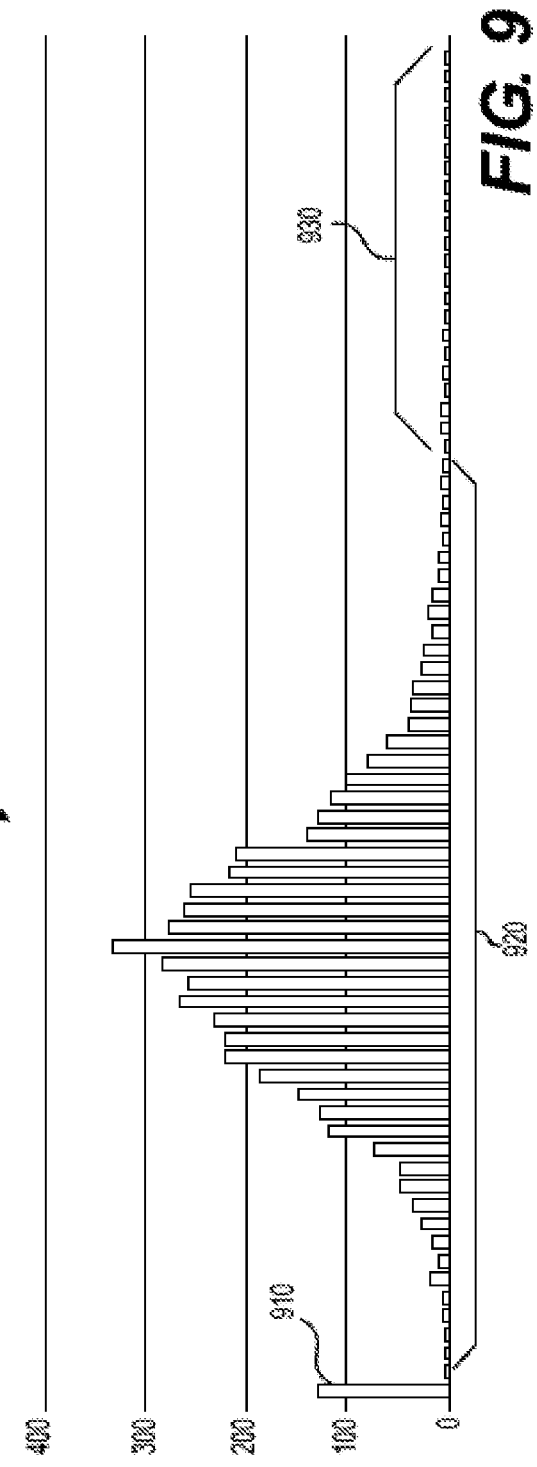
FIG. 9 is a graph showing a Gaussian distribution of temperatures of servers of a datacenter in accordance with an embodiment of the present technology.

FIG. 9 is a graph showing a Gaussian distribution of temperatures of servers of a datacenter in accordance with an embodiment of the present technology. A graph 900 shows a number of servers 400 on a vertical axis and temperature values on a horizontal axis. The graph 900 shows a first number 910 of servers 400 that are turned off. No temperature measurement is received at the database 520 for these servers so they are illustrated as being a lowest definable temperature. Numbers of servers 400 reporting various temperature values are distributed along the horizontal axis, generally following a Gaussian distribution. A vast majority of the servers 400 report temperatures that are within a safe operating range 920. A modest number of servers 400 report temperatures that are in an overheating range 930. The evaluator 530 of FIG. 5 is expected to invoke the action controller 535 to take a corrective action and/or the operator console 550 to issue an alert.

Figure 10:
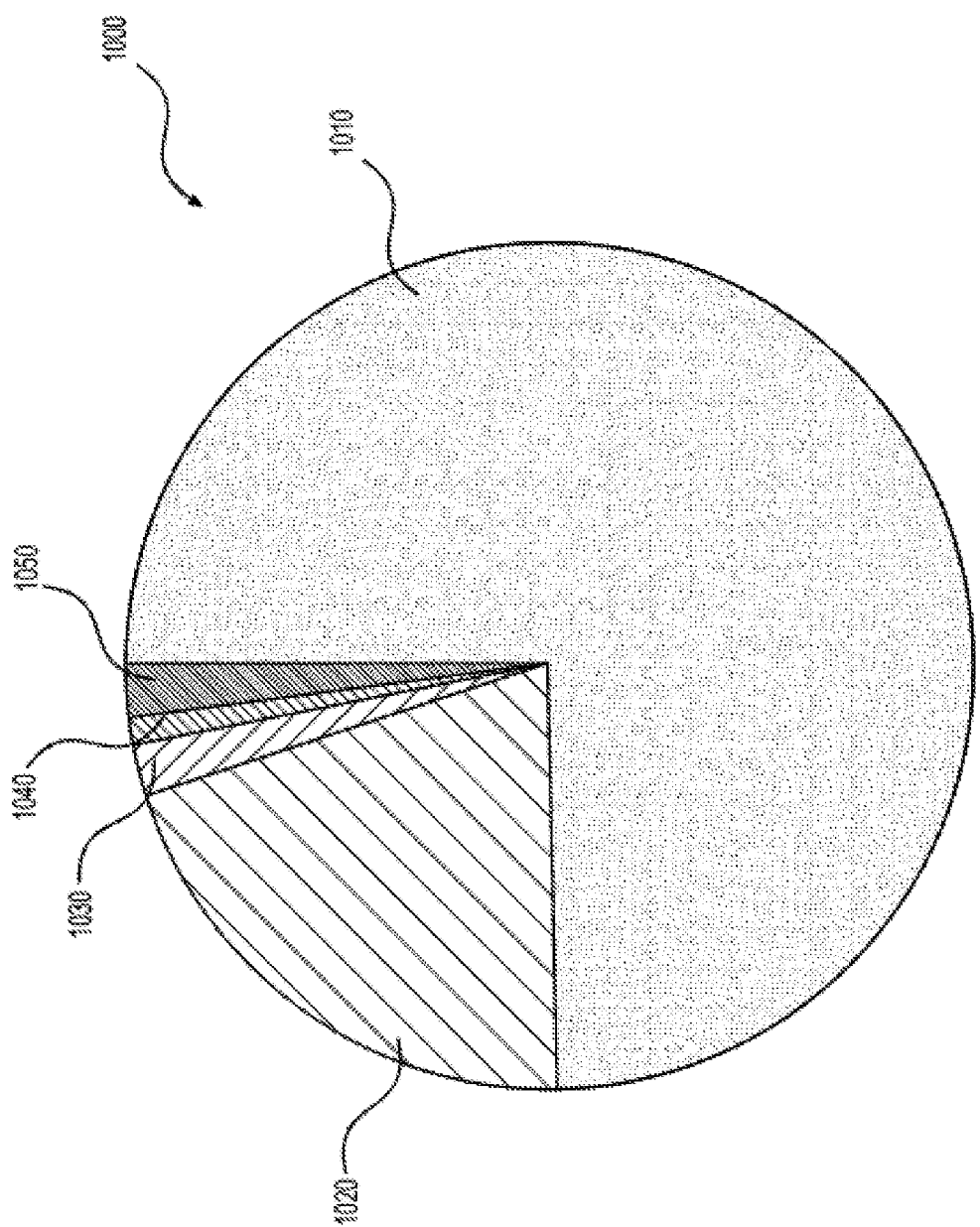
FIG. 10 is a pie diagram showing a proportion of various information elements generated by sensors in the datacenter in accordance with an embodiment of the present technology.

FIG. 10 is a pie diagram showing a proportion of various information elements generated by discrete sensors in the datacenter in accordance with an embodiment of the present technology. In a non-limiting example, a diagram 1000 comprises a section 1010 representing a share of the plurality of servers 400 of the datacenter 500 for which the BMC 430 does not provide any power supply sensor status. A section 1020 represents another share of the servers 400 for which the BMC 430 positively reports the presence of power. Sections 1030 to 1040 represent shares of the servers 400 for which the BMC 430 returns an erroneous status, corrective actions having been taken.

Figure 11:
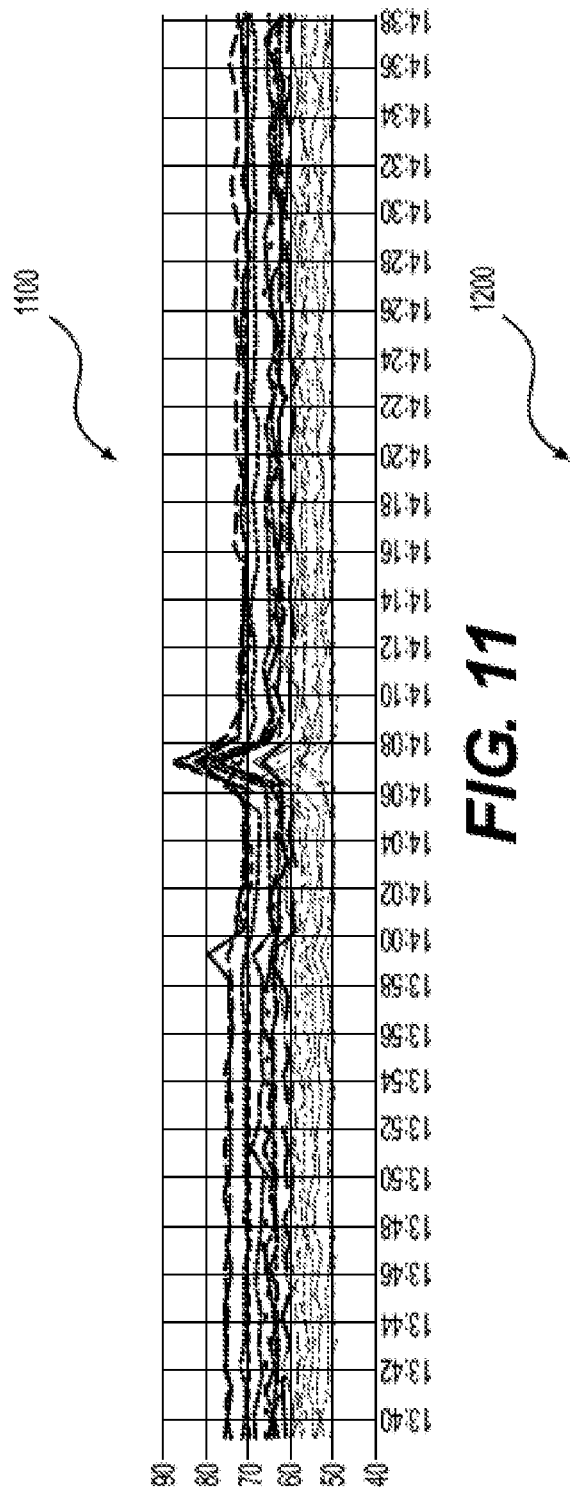
FIG. 11 is graph showing a variation of temperatures over time for each server of a group of servers mounted in a rack of the datacenter in accordance with an embodiment of the present technology.
Figure 12:
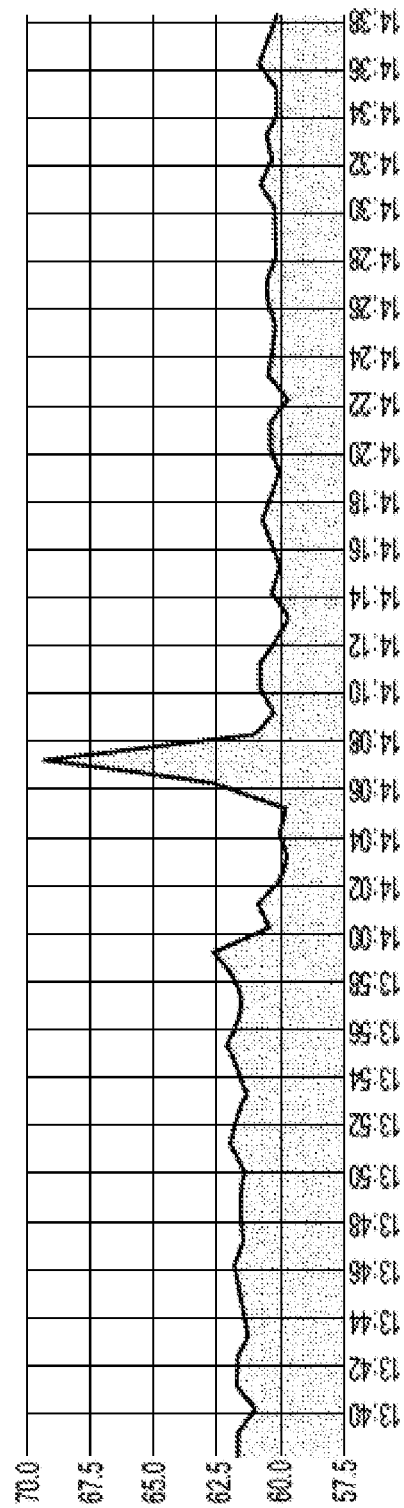
FIG. 12 is a graph showing a variation of an aggregated temperature over time for the group of servers mounted in the rack of the datacenter in accordance with an embodiment of the present technology.

FIG. 11 is graph showing a variation of temperatures over time for each server of a group of servers mounted in a rack of the datacenter in accordance with an embodiment of the present technology. FIG. 12 is a graph showing a variation of an aggregated temperature over time for the group of servers mounted in the rack of the datacenter in accordance with an embodiment of the present technology. On FIGS. 11 and 12, vertical axes show temperatures in degrees Celsius and horizontal axes show the time in HH:MM format. On FIG. 11, a graph 1100 shows a plurality of traces for variations of temperatures in a plurality of servers 400 mounted in a common rack of the datacenter 500. On FIG.

12, a graph 1200 shows a corresponding trace for the aggregated temperature. Considering FIGS. 11 and 12, an overheating condition has affected substantially all of the servers 400 of the rack at about 14:06 hours. This overheating condition appears to have been present at the level of the rack and was not limited to one single server 400. The problem was overcome within about two (2) minutes. A corrective action taken on each of the individual servers 400 of the rack might have not been as efficient as a correction action taken at the level of the common rack.

Figure 13:
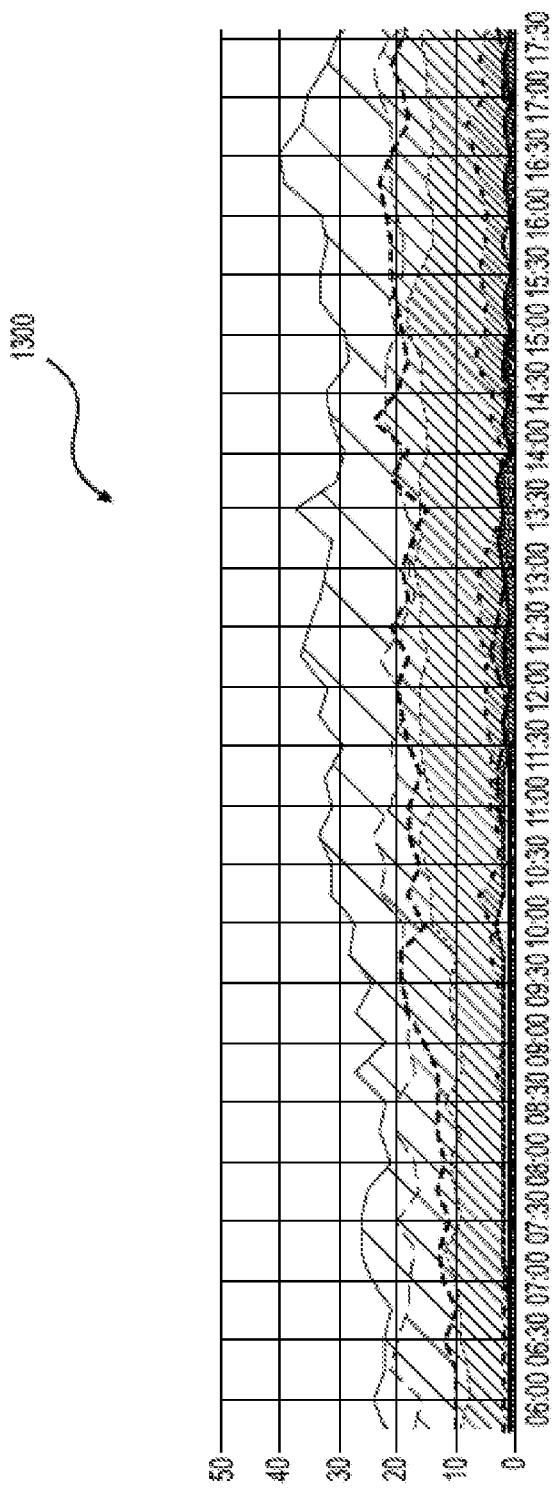
FIG. 13 is a graph showing a variation over time of numbers of overheating servers in a plurality of datacenters in accordance with an embodiment of the present technology.

FIG. 13 is a graph showing a variation over time of numbers of overheating servers in a plurality of datacenters in accordance with an embodiment of the present technology. On a graph 1300, a vertical axis shows a number of overheating servers 400 and a horizontal axis shows the time in HH:MM format. A plurality of curves is shown for a plurality of datacenters 500.

Figures 14, 15:
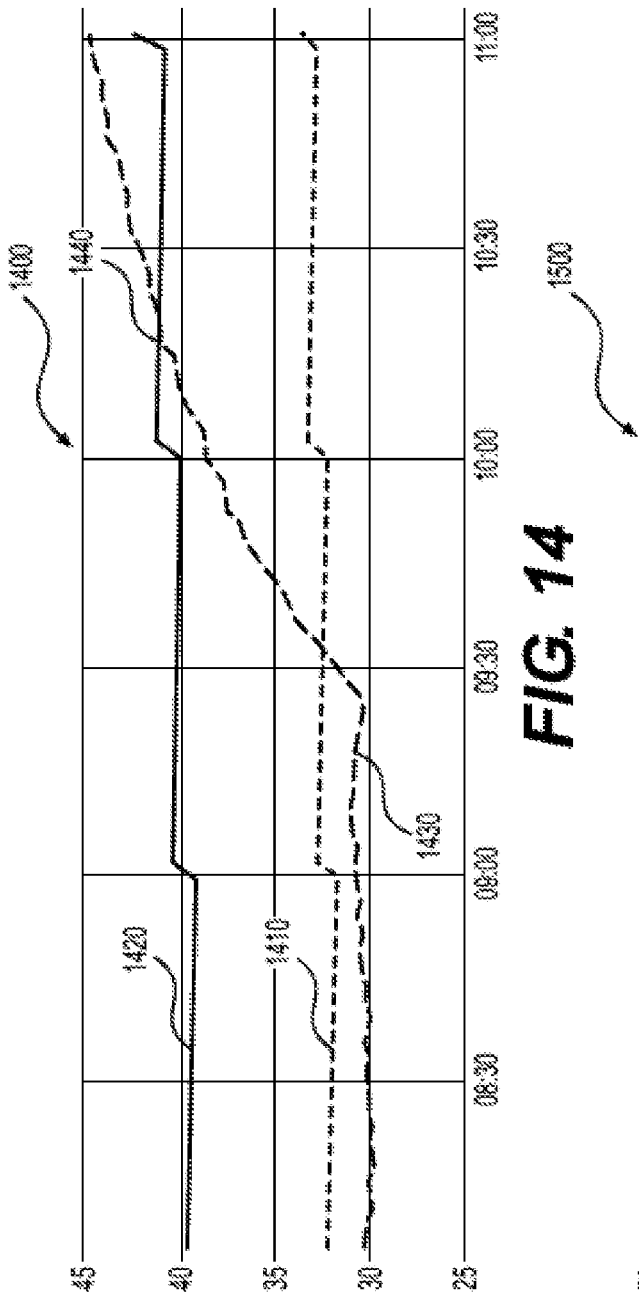
FIG. 14 is a graph showing a variation over a short time scale of a temperature of a server in comparison with a predicted temperature and a normal temperature variation in accordance with an embodiment of the present technology.
FIG. 15 is a graph showing a variation over a short time scale of an aggregated temperature of a room of the datacenter containing a plurality of servers in comparison with a predicted temperature and a normal temperature variation in accordance with an embodiment of the present technology.

FIG. 14 is a graph showing a variation over a short time scale of a temperature of a server in comparison with a predicted temperature and a normal temperature variation in accordance with an embodiment of the present technology. On a graph 1400, a vertical axis shows a temperature of a server 400 in degrees Celsius and a horizontal axis shows the time in HH:MM format. A prediction curve 1410 represents expected temperatures over time according to the prediction model for the server 400. An upper range curve 1420 is defined by adding a normal variation above the expected temperatures of the prediction curve 1410. A temperature curve 1430 is based on actual temperature measurements received from the server 400. The temperature curve 1430 exceeds the upper range curve 1420 starting from a point 1440, substantially at 10:20 hours. At that time, the evaluator 530 should detect the non-compliance and cause the action controller 535 to initiate a corrective action and/or cause the operator console 550 to display alert. Although a corrective action may have been taken, no immediate effect is visible on the graph 1400 and the temperature curve 1430 shows a continued increase of the temperature reported by the server 400.

FIG. 15 is a graph showing a variation over a short time scale of an aggregated temperature of a room of the datacenter containing a plurality of servers in comparison with a predicted temperature and a normal temperature variation in accordance with an embodiment of the present technology. A graph 1500 provides temperature values for a room, which are based on an aggregation of the temperatures reported by a group of servers that includes the server 400 represented in FIG. 14 as well as all other servers 400 installed in the room. The graph 1500 and is thus correlated to the graph 1400. On the graph 1500, a vertical axis shows an aggregated temperature in degrees Celsius for the servers 400 in the room and a horizontal axis shows the time in HH:MM format. A prediction curve 1510 represents expected temperatures over time according to the prediction model for the group of servers 400 present in the room. An upper range curve 1520 is defined by adding a normal variation above the expected temperatures of the prediction curve 1510. A temperature curve 1530 is based on an aggregation of actual temperature measurements received from the servers 400 present in the room. The temperature curve 1530 exceeds the upper range curve 1520 starting from a point 1540, substantially at 09:45 hours. Comparing the graphs 1400 and 1500, the high temperature condition detected at 10:20 hours in the server 400 (at point 1440) appears to be a consequence of a problem that affects the entire room. Although a corrective action may be initiated after 09:45 hours, an effect of this corrective action is still not visible at 11:00 hours.

Figure 16:
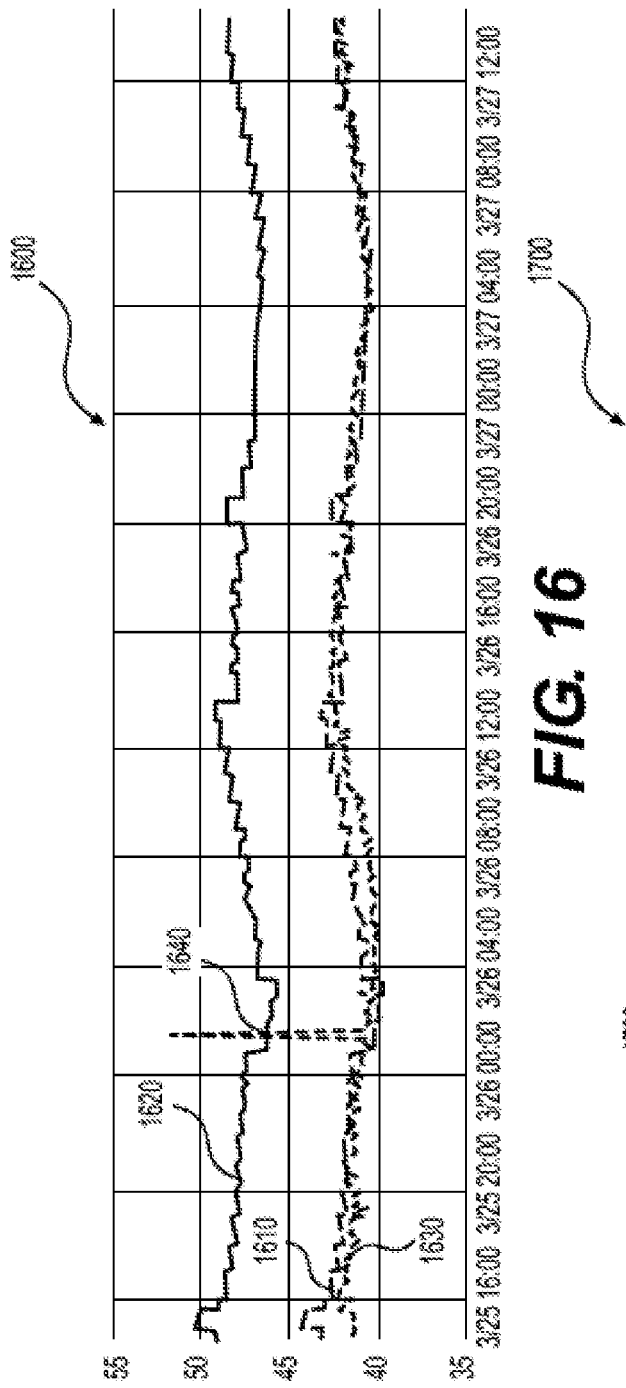
FIG. 16 is a graph showing a variation over a long time scale of an aggregated temperature of a rack of the datacenter containing a plurality of servers in comparison with a predicted temperature and a normal temperature variation in accordance with an embodiment of the present technology.

FIG. 16 is a graph showing a variation over a long time scale of an aggregated temperature of a rack of the datacenter containing a plurality of servers in comparison with a predicted temperature and a normal temperature variation in accordance with an embodiment of the present technology. On a graph 1600, a vertical axis shows an aggregated temperature in degrees Celsius for the servers 400 in the rack and a horizontal axis shows the time in terms of months, days, hours and minutes, in M/DD HH:MM format. A prediction curve 1610 represents expected temperatures over time according to the prediction model for the group of servers 400 present in the rack. An upper range curve 1620 is defined by adding a normal variation above the expected temperatures of the prediction curve 1610. A temperature curve 1630 is based on an aggregation of actual temperature measurements received from the servers 400 present in the rack. The temperature curve 1630 exceeds the upper range curve 1620 at point 1640, substantially at 01:45 hours on March 26. In this example, the evaluator 530 has detected the non-compliance and the action controller 535 has initiated a corrective action. The corrective action has proven effective and the aggregated temperature for the rack has quickly returned to normal values.

Figure 17:
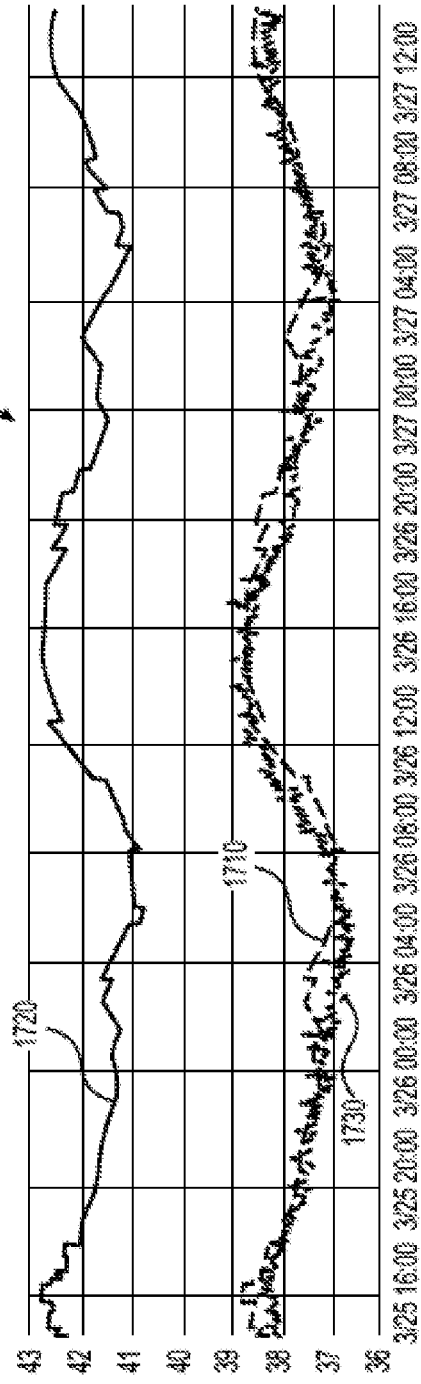
FIG. 17 is a graph showing a variation over a long time scale of an aggregated temperature of a room of the datacenter containing a plurality of server racks in comparison with a predicted temperature and a normal temperature variation in accordance with an embodiment of the present technology.

FIG. 17 is a graph showing a variation over a long time scale of an aggregated temperature of a room of the datacenter containing a plurality of server racks in comparison with a predicted temperature and a normal temperature variation in accordance with an embodiment of the present technology. A graph 1700 provides temperature values for the room, which are based on an aggregation of the temperatures reported by a group of servers that contains all servers 400 present in the room. The room contains a plurality of racks including the particular rack represented in the graph 1600. The graph 1700 is thus correlated to the graph 1600. On the graph 1700, a vertical axis shows an aggregated temperature in degrees Celsius for the servers 400 in the room and a horizontal axis shows the time in M/DD HH:MM format. A prediction curve 1710 represents expected temperatures over time according to the prediction model for the group of servers 400 present in the room. An upper range curve 1720 is defined by adding a normal variation above the expected temperatures of the prediction curve 1710. A temperature curve 1730 is based on an aggregation of actual temperature measurements received from the servers 400 present in the room. Comparing FIGS. 16 and 17, the non-compliance detected at 01:45 hours on March 26 in the particular rack of FIG. 16 is not reflected on the graph 1700. The non-compliance was therefore present in that particular rack and not in other racks installed in the room.

Other types of graphical information for representing the health of the server infrastructure are contemplated. For example, various graphs may provide, for example, an average of measurements per rack or per room, a number of servers whose measurements exceed a threshold in a time interval per rack, per room or per datacenter, an evolution of a measurement over time for a server, measurement information for a plurality of servers based on a common hardware platform, and a heat-map presenting temperatures of all servers in a rack or in a room in color-coded fashion.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

As such, the method, system and datacenter systems implemented in accordance with some non-limiting embodiments of the present technology can be represented as follows, presented in numbered clauses.

Clauses

[Clause 1] A method (600) for supervising a health of a server infrastructure, comprising:
periodically storing (620), in a database (520), measurements received from a server (400) of the server infrastructure;
training (625) a machine learning system (525) using the stored measurements to construct a prediction model for the server (400);
evaluating (660) a compliance of a latest measurement received from the server (400) with the prediction model for the server (400); and
taking (670) a corrective action if the latest measurement does not comply with the prediction model for the server (400).

[Clause 2] The method (600) of clause 1, wherein the machine learning system (525) is trained using accumulated measurements stored in the database (520).

[Clause 3] The method (600) of clause 2, further comprising:
receiving (630) a new measurement from the server (400);
storing (635) the new measurement in the database (520); and
using the new measurement to update (640) the prediction model.

[Clause 4] The (600) of clause 3, further comprising updating (642) the prediction model using a moving average of past estimated errors.

[Clause 5] The method (600) of any one of clauses 1 to 4, further comprising consolidating (615) the measurements on the basis of a classification for the server.

[Clause 6] The method (600) of any one of clauses 1 to 5, further comprising sending (605) measurement requests, from a polling node (510, 515) to the server (400), at each of successive polling periods, wherein the measurements are received in response to the measurement requests.

[Clause 7] The method (600) of clause 6, wherein the measurement requests and received signals carrying the measurements are exchanged between the polling node (510, 515), the server (400) and the database (520) using an intelligent platform management interface (IPMI) protocol.

[Clause 8] The method (600) of any one of clauses 1 to 7, wherein evaluating (660) the compliance of the latest measurement received from the server (400) with the prediction model for the server (400) comprises:
defining (650) a normal variation from the prediction model for the server (400);
determining (662) that the latest measurement complies with the prediction model for the server (400) if a difference between the latest measurement and a corresponding value defined by the prediction model for the server (400) is less than or equal to the normal variation.

[Clause 9] The method (600) of clause 8, wherein:
the latest measurement is a temperature of a processor (410) of the server (400);
the normal variation comprises a maximum delta above a current temperature defined by the prediction model for the server (400); and
the normal variation comprises the minimum delta below the current temperature defined by the prediction model for the server (400).

[Clause 10] The method (600) of clause 8, wherein:
the latest measurement is a temperature of a processor (410) of the server (400);
the normal variation comprises a maximum delta above a current temperature defined by the prediction model for the server (400); and
the normal variation comprises an unlimited delta below the current temperature defined by the prediction model for the server (400).

[Clause 11] The method (600) of clause 9 or 10, further comprising:
defining a static temperature threshold; and
taking a corrective action if the temperature of a processor (410) of the server (400) exceeds the static temperature threshold.

[Clause 12] The method (600) of any one of clauses 8 to 11, further comprising defining (650) the normal variation from the prediction model for the server (400) according to a $k^{th}$ percentile of differences between measurements stored over a predetermined timeframe ending at the present time and corresponding values defined by the prediction model for the server (400), wherein k is a number less than 100.

[Clause 13] The method (600) of any one of clauses 8 to 11, further comprising defining (650) the normal variation from the prediction model for the server (400) according to a predetermined multiple of an average of differences between measurements stored over a predetermined timeframe ending at the present time and corresponding values defined by the prediction model for the server (400).

[Clause 14] The method (600) of any one of clauses 8 to 13, further comprising:
receiving (652) a current value for a secondary parameter related to the server (400);
calculating (654) a difference between the current value for the secondary parameter related to the server (400) and a previous value for the secondary parameter related to the server (400);
if the difference between the current and the previous value for the secondary parameter related to the server (400) exceeds a predetermined threshold, increasing (656) a magnitude of the normal variation from the prediction model for the server (400).

[Clause 15] The method (600) of clause 14, wherein the secondary parameter is selected from a load on a processor (410) of the server (400), a power consumption of the processor (410) of the server (400), a supply voltage to the processor (410) of the server (400), a flow of a fluid for cooling the processor (410) of the server (400), a temperature of the fluid for cooling the processor (410) of the server (400) and an ambient temperature at the server (400).

[Clause 16] The method (600) of any one of clauses 1 to 15, wherein the machine learning system (525) constructs the prediction model by applying, on the stored measurements, a forecasting algorithm selected from an autoregressive integrated moving average (ARIMA), a triple exponential smoothing (Holt-Winters), a Fast Fourier transform (FFT) decomposition, a current state redefinition, a polynomial combination, a linear regression, a multilayer perceptron (MLP), a long short-term memory (LSTM), a Gaussian distribution, and a combination thereof.

[Clause 17] The method (600) of any one of clauses 1 to 16, wherein the measurement is provided by a sensor (450, 460, 470, 480) of a parameter of the server (400).

[Clause 18] The method (600) of clause 17, wherein the parameter of the server (400) is a temperature of a processor (410) of the server (400).

[Clause 19] The method (600) of clause 18, wherein taking (670) the corrective action comprises increasing (672) a heat transfer rate of a cooling system for the server (400).

[Clause 20] The method (600) of clause 19, wherein increasing (672) the heat transfer rate of the cooling system for the server (400) comprises an element selected from increasing a flow of air-cooling provided to the server (400), increasing a flow of liquid cooling provided to the server (400), and a combination thereof.

[Clause 21] The method (600) of clause 20, wherein increasing the flow of air cooling provided to the server (400) comprises an element selected from opening a ventilation inlet, opening a ventilation outlet, starting one or more fans, increasing a fan speed, and a combination thereof.

[Clause 22] The method (600) of any one of clauses 1 to 21, wherein the corrective action is selected from reducing a processing speed of the server (400), reducing a processing power of the server (400), reducing a traffic load directed to the server (400), transferring a virtual machine from the server (400) to another server (400), increasing a heat transfer rate of a cooling system for the server (400), reducing a period for storing the measurements received from the server (400), and a combination thereof.

[Clause 23] The method (600) of clause 6 or 7, further comprising:
sending (605) a plurality of measurement requests from the polling node (510, 515) to a corresponding plurality of servers (400) at each of the successive polling periods; and
storing (620), in the database (520), respective measurements received from each of the plurality of servers (400) at each of the successive polling periods.

[Clause 24] The method (600) of clause 23, further comprising training (625) the machine learning system (525) using the respective stored measurements to construct a prediction model for each of the plurality of servers (400).

[Clause 25] The method (600, 700) of clause 23 or 24, further comprising:
aggregating (710) the respective measurements received at each given polling period from a subset of the plurality of servers (400);
training (720) the machine learning system (525) using the aggregated measurements to construct a prediction model for the subset of the plurality of servers (400); and
evaluating (740) a compliance of latest aggregated measurements with the prediction model for the subset of the plurality of servers (400).

[Clause 26] The method (600, 700) of clause 25, wherein the subset of the plurality of servers (400) comprises servers (400) installed on a same rack.

[Clause 27] The method (600, 700) of clause 25, wherein the subset of the plurality of servers (400) comprises servers (400) installed on a same room.

[Clause 28] The method (600, 700) of clause 25, wherein the subset of the plurality of servers (400) comprises servers (400) installed in a same datacenter (500).

[Clause 29] The method (600, 700) of any one of clauses 25 to 28, wherein aggregating (710) the respective measurements received at each given polling period from the subset of the plurality of servers (400) comprises averaging (712) the respective measurements received at each given polling period from the subset of the plurality of servers (400).

[Clause 30] The method (600, 700) of any one of clauses 25 to 29, further comprising:
defining (730) a normal variation from the prediction model for the subset of the plurality of servers (400);
determining (742) that the latest aggregated measurements comply with the prediction model for the subset of the plurality of servers (400) if a difference between the latest aggregated measurements and a corresponding value defined by the prediction model for the subset of the plurality of servers (400) is less than or equal to the normal variation.

[Clause 31] The method (600, 700) of clause 30, further comprising:
detecting (732) a change of a number of servers (400) in the subset of the plurality of servers (400); and
increasing (734) a magnitude of the normal variation from the prediction model for the subset of the plurality of servers (400).

[Clause 32] A system for supervising a health of a server infrastructure, comprising:
a database (520) configured to:
receive measurements from one or more servers (400) of the server infrastructure, and
store the measurements received from the one or more servers (400);
a machine learning system (525) configured to:
read the measurements from the database (520), and
use the measurements to construct a prediction model for each of the one or more servers (400);
a processor operatively connected to the database (520) and to the machine learning system (525); and
a non-transitory computer-readable medium having stored thereon machine executable instructions for performing, when executed by the processor, the method (600, 700) according to any one of clauses 1 to 31.

[Clause 33] A system for supervising a health of a server infrastructure, comprising:
a database (520) configured to:
receive measurements from one or more servers (400) of the server infrastructure, and
store the measurements received from the one or more servers (400); a machine learning system (525) configured to:
read the stored measurements for each of the one or more servers (400) from the database (520), and
for each respective server (400), construct a prediction model based on measurements stored in the database (520) at successive polling periods for the respective server (400); and
an evaluator (530) operatively connected to the database (520) and the machine learning system (525), the evaluator (530) being configured to:
receive, from a given server (400), a latest measurement for the given server (400),
evaluate a compliance of the latest measurement for the given server (400) with the prediction model for the given server (400), and
initiate a corrective action for the given server (400) if the latest measurement does not comply with the prediction model for the given server (400).

[Clause 34] The system of clause 33, further comprising a polling node (510, 515) configured to send a measurement request to the one or more servers (400) at each of the successive polling periods, wherein the measurements are received from the one or more servers (400), at the database (520), in response to the measurement requests.

[Clause 35] The system of clause 33 or 34, further comprising an operator console (550) operatively connected to the evaluator (530), the operator console (550) being configured to issue an alert if the latest measurement for the given server (400) does not comply with the prediction model for the given server (400).

[Clause 36] The system of any one of clauses 33 to 35, further comprising an action controller (535) operatively connected to the evaluator (530), the action controller (535) being configured to cause the given server (400) to apply the corrective action selected from reducing a processing speed of the given server (400), reducing a processing power of the given server (400), reducing a traffic load directed to the given server (400), transferring a virtual machine from the given server (400) to another server (400), increasing a heat transfer rate of a cooling system for the given server (400), and a combination thereof.

[Clause 37] The system of clause 34, further comprising an action controller (535) operatively connected to the evaluator (530) and to the polling node (510, 515), the action controller (535) being configured to reduce a delay being each of the successive polling periods for the given server (400).

[Clause 38] A datacenter (500), comprising:
a server infrastructure comprising a plurality of servers (400), each server (400) comprising a sensor (450, 460, 470, 480) configured to provide a measurement;
a repository (505) configured to store identities of each of the plurality of servers (400);
a polling node (510, 515) configured to receive the identities of the plurality of servers (400) from the repository (505); and
the system of clause 32 or 33.

[Clause 39] A datacenter (500), comprising:
a plurality of servers (400), each server (400) comprising a sensor (450, 460, 470, 480) configured to provide a measurement;
a repository (505) configured to store identities of each of the plurality of servers (400);
a polling node (510, 515) configured to:
acquire a list of servers (400) from the repository (505), and
send, at each of successive polling periods, a measurement request to each server (400) of the list of servers (400);
a database (520) configured to:
receive measurements from each server (400) of the list of servers (400) at each of the successive polling periods, and
store the received measurements;
a machine learning system (525) configured to:
read the stored measurements for each respective server (400) from the database (520), and
construct a prediction model for each respective server (400) based on the stored measurements for the respective server (400);
an evaluator (530) configured to:
receive a latest measurement from a given server (400),
fetch the prediction model for the given server (400) from the machine learning system (525), and
evaluate a compliance of the latest measurement with the prediction model for the given server (400); and
an action controller (535) configured to:
receive a compliance result for the given server (400) from the evaluator (530), and
take a corrective action for the given server (400) if the latest measurement does not comply with the prediction model for the given server (400).

[Clause 40] The datacenter (500) of clause 39, wherein:
the poller is one of a plurality of pollers; and
the list of servers is one of a plurality of lists of servers, each poller of the plurality of pollers acquiring a corresponding list of the plurality of lists.

[Clause 41] The datacenter (500) of clause 40, further comprising an allocating processor (540) configured to allocate each server (400) of the plurality of servers (400) to one of the plurality of lists of servers (400).

[Clause 42] The datacenter (500) of clause 41, wherein the allocating processor (540) is a load-balancing processor.

[Clause 43] The datacenter (500) of clause 40, wherein:
a first polling node (510, 515) of the plurality of polling nodes (510, 515) implements a first polling interval;
a second polling node (510, 515) of the plurality of polling nodes (510, 515) implements a second polling interval shorter than the first polling interval; and
the action controller (535) causes the allocating processor (540) to assign the given server (400) to the second polling node (510, 515) if the latest measurement does not comply with the prediction model for the given server (400).

[Clause 44] The datacenter (500) of any one of clauses 39 to 43, further comprising an operator console (550) operatively connected to the evaluator (530) and configured to issue an alert indicative of the compliance result for the given server (400) if the latest measurement does not comply with the prediction model for the given server (400).

[Clause 45] The datacenter (500) of any one of clauses 39 to 44, wherein the action controller (535) is configured to provide a command to the given server (400) if the latest measurement does not comply with the prediction model for the given server (400), the command causing the given server (400) to reduce a processing speed of the given server (400), reduce a processing power of the given server (400), reduce a traffic load directed to the given server (400), transfer a virtual machine from the given server (400) to another server (400), increase a capacity of a cooling system for the given server (400), and a combination thereof.

[Clause 46] The datacenter (500) of any one of clauses 39 to 45, wherein:
the servers (400) of the plurality of servers (400) are assembled in groups, each group of servers (400) being installed in a common rack or in a common room of the datacenter (500);
the datacenter (500) further comprises an aggregator (545) configured to aggregate respective measurements received at each given polling period from the servers (400) of the given group;
the database (520) is further configured to store the aggregated measurements;
the machine learning system (525) is further configured to construct a prediction model for the servers (400) of the given group based on the aggregated measurements; and the evaluator (530) is further configured to evaluate a compliance of latest aggregated measurements with the prediction model for the servers (400) of the given group.

[Clause 47] The datacenter (500) of clause 46, wherein the evaluator (530) is further configured to:
define a normal variation from the prediction model for the servers (400) of the given group; and
determine that the latest aggregated measurements comply with the prediction model for the servers (400) of the given group if a difference between the latest aggregated measurements and a corresponding value defined by the prediction model for the servers (400) of the given group is less than or equal to the normal variation.

[Clause 48] The datacenter (500) of any one of clauses 39 to 47, wherein:
each server (400) of the plurality of servers (400) comprises a processor (410) and a board management controller, BMC (430), operatively connected to the processor (410);
the measurement provided by the sensor (450, 460, 470, 480) of each server (400) is a measurement of an operational parameter of the processor (410) the server (400); and
on each server (400), the BMC (430) is configured to receive the measurement request from the polling node (510, 515) and to transmit the measurement from the sensor (450, 460, 470, 480) to the database (520) in response to receiving the measurement request from the polling node (510, 515).

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A method for supervising a health of a server infrastructure, comprising:
sending temperature measurement requests, from a polling node to a server of the server infrastructure, at each of successive polling periods;
storing, in a database, temperature measurements received from the server in response to the temperature measurement requests;
training a machine learning model using accumulated temperature measurements stored in the database to construct a prediction model forecasting temperature for the server;
determining a normal variation from the prediction model;
evaluating a compliance of a latest temperature measurement received from the server with the prediction model, wherein the evaluating comprises determining that the latest temperature measurement complies with the prediction model when a difference between the latest temperature measurement and a temperature value forecasted by the prediction model is less than or equal to the normal variation; and
taking a corrective action if the latest temperature measurement does not comply with the prediction model.

2. The method of claim 1, further comprising:
receiving a new temperature measurement from the server;
storing the new temperature measurement in the database; and
using the new temperature measurement to update the prediction model.

3. The method of claim 1, further comprising:
receiving a current value for a secondary parameter related to the server;
calculating a difference between the current value for the secondary parameter related to the server and a previous value for the secondary parameter related to the server; and
if the difference between the current and the previous value for the secondary parameter related to the server exceeds a predetermined threshold, increasing a magnitude of the normal variation from the prediction model.

4. The method of claim 1, wherein:
the temperature measurements comprise a temperature of a processor of the server; and
the corrective action is selected from increasing a heat transfer rate of a cooling system for the server, reducing a processing speed of the server, reducing a processing power of the server, reducing a traffic load directed to the server, transferring a virtual machine from the server to another server, reducing a period for storing the temperature measurements received from the server, and a combination thereof.

5. The method of claim 1, further comprising:
sending a plurality of temperature measurement requests from the polling node to a corresponding plurality of servers at each of the successive polling periods;
storing, in the database, respective temperature measurements received from each of the plurality of servers at each of the successive polling periods; and
training the machine learning model using the respective stored temperature measurements to construct a respective prediction model forecasting temperature for each of the plurality of servers.

6. The method of claim 1, further comprising:
sending a plurality of temperature measurement requests from the polling node to a corresponding plurality of servers at each of the successive polling periods;
storing, in the database, respective temperature measurements received from each of the plurality of servers at each of the successive polling periods;
consolidating the respective temperature measurements received at each given polling period from the plurality of servers, wherein the plurality of servers is installed on a same rack, in a same room or in a same datacenter;
aggregating the respective temperature measurements received at each given polling period from the plurality of servers;
training the machine learning model using the aggregated temperature measurements to construct a prediction model forecasting temperature for the plurality of servers; and
evaluating a compliance of latest aggregated measurements with the prediction model for the plurality of servers.

7. The method of claim 6, further comprising:
defining a second normal variation from the prediction model for the plurality of servers; and
determining that the latest aggregated temperature measurements comply with the prediction model for the plurality of servers if a difference between the latest aggregated temperature measurements and a corresponding value defined by the prediction model for the plurality of servers is less than or equal to the second normal variation.

8. A system for supervising a health of a server infrastructure, comprising:
at least one processor; and
memory comprising executable instructions, which, when executed by the at least one processor, cause the system to:
send a temperature measurement request to one or more servers of the server infrastructure at each of successive polling periods;
receive temperature measurements from the one or more servers of the server infrastructure, wherein the temperature measurements are received in response to the temperature measurement requests, and
store the temperature measurements received from the one or more servers in a database;
read the stored temperature measurements for each of the one or more servers from the database, and
for each respective server, train a machine learning model to construct a prediction model forecasting temperature based on temperature measurements stored in the database at successive polling periods for the respective server; and
define a normal variation from the prediction model for a given server,
receive, from the given server, a latest temperature measurement for the given server,
evaluate a compliance of the latest temperature measurement for the given server with the prediction model for the given server, wherein the evaluating comprises determining that the latest temperature measurement complies with the prediction model for the given server when a difference between the latest temperature measurement and a temperature value forecasted by the prediction model for the given server is less than or equal to the normal variation, and
initiate a corrective action for the given server if the latest temperature measurement does not comply with the prediction model for the given server.

9. The system of claim 8, wherein the instructions, when executed by the at least one processor, further cause the system to issue an alert if the latest temperature measurement for the given server does not comply with the prediction model for the given server.

10. The system of claim 8, wherein the corrective action comprises increasing a heat transfer rate of a cooling system for the given server, reducing a processing speed of the given server, reducing a processing power of the given server, reducing a traffic load directed to the given server, or transferring a virtual machine from the given server to another server.

11. A datacenter, comprising:
a plurality of servers, each server comprising a sensor configured to provide a temperature measurement; and
a system comprising at least one processor and memory comprising executable instructions, wherein the executable instructions, when executed by the at least one processor, cause the system to:
send, at each of successive polling periods, a temperature measurement request to each server of the plurality of servers;
receive temperature measurements from each server of the plurality of servers at each of the successive polling periods;
store the received temperature measurements in a database;
read the stored temperature measurements for each respective server from the database, and
train a machine learning model, using the stored temperature measurements for the respective server, to generate a prediction model forecasting temperature for each respective server;
receive a latest temperature measurement from a given server;
fetch the prediction model for the given server from the machine learning system;
determine a normal variation from the prediction model for the given server; and
evaluate a compliance of the latest temperature measurement with the prediction model for the given server, wherein the evaluating comprises determining that the latest temperature measurement complies with the prediction model for the given server when a difference between the latest temperature measurement and a temperature value forecasted by the prediction model for the given server is less than or equal to the normal variation; and
take a corrective action for the given server if the latest temperature measurement does not comply with the prediction model for the given server.

12. The datacenter of claim 11, wherein:
the servers of the plurality of servers are assembled in groups, each group of servers being installed in a common rack or in a common room of the datacenter, and wherein the instructions, when executed by the at least one processor, further cause the system to:
consolidate and aggregate respective temperature measurements received at each given polling period from the servers of a given group;
store the aggregated temperature measurements;
construct a prediction model forecasting temperature for the servers of the given group based on the aggregated temperature measurements; and
evaluate a compliance of latest aggregated temperature measurements with the prediction model for the servers of the given group.

13. The datacenter of claim 11, wherein:
each server of the plurality of servers comprises a processor and a board management controller, BMC, operatively connected to the processor and to the sensor;
the temperature measurement provided by the sensor of each server is a measurement of an operational parameter of the processor of the server; and
on each server, the BMC is configured to receive the temperature measurement request and, in response to receiving the temperature measurement request, read the temperature measurement from the sensor and transmit the temperature measurement.

14. A method for controlling a temperature of a server of a server infrastructure, comprising:
sending temperature measurement requests, from a polling node to the server of the server infrastructure, at each of successive polling periods;
receiving temperature measurements from the server in response to the temperature measurement requests;
storing, in a database, the temperature measurements received from the server in response to the temperature measurement requests;
defining a normal variation from a prediction model forecasting temperature values over time for the server, the prediction model being constructed by a machine learning system having been trained using accumulated temperature measurements stored in the database;

receiving a new temperature measurement from the server at a time of the new temperature measurement;

evaluating a compliance of the new temperature measurement received from the server with the prediction model for the server by determining that the new temperature measurement complies with the prediction model for the server when a difference between the new temperature measurement and a temperature value forecasted by the prediction model for the server for the time of the new temperature measurement is less than or equal to the normal variation from the prediction model for the server; and taking a corrective action applied to the server if the new temperature measurement does not comply with the prediction model for the server.

15. The method of claim 14, further comprising:

storing the new temperature measurement in the database; and using the new temperature measurement to update the prediction model for the server.

16. The method of claim 14, further comprising:

receiving a first value for a secondary parameter related to the server, the secondary parameter being selected from a load on a processor of the server, a power consumption of the processor of the server, a supply voltage to the processor of the server, a flow of a fluid for cooling the processor of the server, a temperature of the fluid for cooling the processor of the server and an ambient temperature at the server;

after receiving the first value for the secondary parameter related to the server, receiving a second value for the secondary parameter related to the server;

calculating a difference between the second value for the secondary parameter related to the server and the first value for the secondary parameter related to the server; and if the difference between the second and the first value for the secondary parameter related to the server exceeds a predetermined threshold, increasing a magnitude of the normal variation from the prediction model for the server.

17. The method of claim 14, wherein:

the temperature measurements are temperature measurements of a processor of the server; and the corrective action is selected from increasing a heat transfer rate of a cooling system for the server, reducing a processing speed of the server, reducing a processing power of the server, reducing a traffic load directed to the server, transferring a virtual machine from the server to another server, reducing a time between successive temperature measurement requests, and a combination thereof.

18. The method of claim 14, further comprising:

sending a plurality of temperature measurement requests from the polling node to a corresponding plurality of servers at each of the successive polling periods;

storing, in the database, respective temperature measurements received from each of the plurality of servers at each of the successive polling periods; and training further the machine learning system using the respective stored temperature measurements to construct a respective prediction model forecasting temperature values over time for each of the plurality of servers.

* * * * *